US008657191B2

(12) United States Patent
Zieren et al.

(10) Patent No.: US 8,657,191 B2
(45) Date of Patent: Feb. 25, 2014

(54) MAGNETIC DETECTION OF BACK-SIDE LAYER

(75) Inventors: Victor Zieren, Valkenswaard (NL);
Robertus A. M. Wolters, Eindhoven (NL)

(73) Assignee: NXP B.V., Eindhoven (NL)

( * ) Notice: Subject to any disclaimer, the term of this patent is extended or adjusted under 35 U.S.C. 154(b) by 453 days.

(21) Appl. No.: 12/682,762

(22) PCT Filed: Oct. 16, 2008

(86) PCT No.: PCT/IB2008/054260
§ 371 (c)(1),
(2), (4) Date: Apr. 12, 2010

(87) PCT Pub. No.: WO2009/050672
PCT Pub. Date: Apr. 23, 2009

(65) Prior Publication Data
US 2010/0283456 A1   Nov. 11, 2010

(30) Foreign Application Priority Data

Oct. 18, 2007  (EP) .................................... 07118812

(51) Int. Cl.
*G06K 7/08* (2006.01)
*G06K 21/06* (2006.01)

(52) U.S. Cl.
USPC .......................................... 235/449; 235/492

(58) Field of Classification Search
USPC ............. 235/492, 449; 506/9; 257/414, 427, 257/E27; 438/3
See application file for complete search history.

(56) References Cited

U.S. PATENT DOCUMENTS

| 2001/0003302 | A1 | 6/2001 | Azar | |
|---|---|---|---|---|
| 2005/0116307 | A1* | 6/2005 | De Jongh et al. | 257/414 |
| 2005/0230770 | A1 | 10/2005 | Oohira | |
| 2005/0247797 | A1* | 11/2005 | Ramachandran | 235/492 |
| 2007/0037195 | A1* | 2/2007 | Ho | 435/6 |
| 2007/0099308 | A1* | 5/2007 | Chung et al. | 438/3 |
| 2008/0099863 | A1* | 5/2008 | Lee et al. | 257/427 |
| 2009/0149340 | A1* | 6/2009 | True | 506/9 |

FOREIGN PATENT DOCUMENTS

| GB | 2126009 A | 3/1984 |
|---|---|---|
| WO | 98/18102 A1 | 4/1998 |
| WO | 01/50530 A1 | 7/2001 |
| WO | 03/085410 A | 10/2003 |

OTHER PUBLICATIONS

Ravikanth, Pappu Srinivasa; "Physical One-Way Funcations"; MIT; Mar. 2001.
Schneider, M., et al; "Integrated Micromachined Decoupled CMOS Chip on Chip"; Micro Electro Mechanical Systems; 1997; MEMS; IEEE; pp. 512-517.
Tuyls, P., et al; "Information-Theoretic Security Analysis of Physical Uncloneable Functions"; Philips Research Labs, Eindhoven, Netherlands; 15 Pages.
Zieren, V. "Integrated Silicon Multicollector Magnetotransistors", PhD Thesis, Delft University of Technology, The Netherlands, 232 pgs, retrieved from the internet (Sep. 5, 2013): repository.tudelft.nl/assets/uuid:41cb3a97-a5ae-4758-8014.../284414.pd (1983).
Roumenin, C. S. "Handbook of Sensors and Actuators", Solid-State Magnetic Sensors, vol. 2 (1994).
Middelhoek, S. et al. "Silicon Sensors", London Academic Press (1989).
O'Handley, R. C. "Modern Magnetic Materials Principles and Applications", Wiley-Interscience (1999).
Chun, Y.S. et al. "Interlayer Perpendicular Domain Coupling Between Thin Fe Films and Garnet Single-Crystal Underlayers", Journal of Applied Physics, vol. 95, No. 11, 3 pgs (Jun. 2004).

* cited by examiner

Primary Examiner — Thien T Mai

(57) ABSTRACT

The invention relates to an integrated circuit comprising a substrate having a first side and a second opposing side. An electronic circuit (EC) is provided at the first side (S1) of the substrate, wherein the electronic circuit (EC) comprises at least one magnetic field sensor (Snsr, Snsr1, Snsr2, Snsr3, Snsr4). The integrated circuit further comprises a magnetizable region (MR) provided on the second side (S1) of the substrate (SUB) by using a wafer-level type deposition processing step. The magnetic moment of the magnetizable region (MR) is configurable for generating a magnetic field (H1, H2) detectable at the location of the at least one magnetic field sensor (Snsr, Snsr1, Snsr2, Snsr3, Snsr4). The integrated circuit constitutes a very simple construction and enables a strongly miniaturized solution which is, because of its reduced dimensions well suitable for being used in bank cards. An attempt to remove the integrated circuit according to the invention from its environment (e.g. a bank card) may result in the magnetizable region (MR) getting damaged (partially removed) or even completely removed. The invention provides a first level of security against external attack. Embodiments of the invention provide higher security levels. Various magnetic field sensors are illustrated which may be advantageously integrated in the integrated circuit. The invention also relates to a card provided with such integrated circuit. The card in accordance with the invention is more secure. The invention further relates to a method of initializing such integrated circuit and a method of checking the authenticity of such integrated circuit.

20 Claims, 8 Drawing Sheets

MAGNETIC DETECTION OF BACK-SIDE LAYER

FIELD OF THE INVENTION

The invention relates to an integrated circuit in accordance with claim 1, a card provided with such integrated circuit, a method of initializing such integrated circuit, and a method of checking the authenticity such integrated circuit.

BACKGROUND OF THE INVENTION

Integrated circuits (IC's) for applications such as smart-cards, RFID tags, Pay-TV chips often contain a secret security key and carry out secret functions. The IC needs to be secure against attacks from the outside which aim at retrieving data there from. IC's may be subjected to both front-side as well as back-side attacks. In this description the "front-side" of a semiconductor device is defined as the side of the semiconductor device on which circuitry is provided. This side is also being referred to as the "first side of the substrate" in this description. Likewise, the "back-side" of the semiconductor device is defined as the side opposite to the front-side and this side is also being referred to as the "second side of the substrate" in this description. Back-side attacks may consist of various analysis techniques such as light or photon emission detection, thermal infrared detection, liquid crystal detection, voltage or electric field detection, and electro magnetic detection methods. Often these methods are used in combination with invasive attacks such as wafer thinning, laser cutting and heating, focused ion beam (FIB) techniques. Also light or laser flash methods are used from the back-side in order to force signals to flip. When any one of the above-mentioned techniques is used in combination with mathematical attacks, these attacks can be very powerful. Because a lot of the earlier-mentioned techniques are done from the back-side of the IC, it is essential that the back-side of these IC's are well protected. Physical attacks from the back side of an IC are becoming an increasingly important threat for IC's, and especially for bank cards. In the prior art, various protection schemes are disclosed.

Front side attacks are becoming less attractive as the number of metallization (interconnection) levels as well as their density increases with the technology nodes. This will shadow the circuitry of interest and, moreover, tiling (in-laid metal parts for CMP reasons) supports this effect even more.

US2001/003302 discloses an integrated circuit device comprising: a circuit which uses encryption, and an encapsulation packaging layer, in which the circuit is responsive to a magnetic field generated by the encapsulation to apply the encryption and/or decryption by reading the key there from, so that tampering with the encapsulation to gain access to the circuit causes the encryption and/or decryption to fail. The integrated circuit device comprises a matrix of sensors in a device substrate which are Hall effect sensors, which may comprise a thin film of Indium Arsenide in an opening in the upper layer of the chip. The encapsulation surrounds the device substrate on both sides, and comprises an epoxy resin matrix. In the epoxy resin matrix, a plurality of particles 360 are provided, of various sizes, shapes and/or magnetic permeabilities. These particles may be made out of Ni—Co—Fe alloy (i.e. a Ferrite alloy). A pair of plate-shaped permanent magnets are provided above and below the encapsulation layers, and bonded thereto by the epoxy resin. The magnets are arranged with their poles aligned in the same direction, which is conveniently perpendicular to the plates. Surrounding the plates and encapsulation is an outer casing of soft magnetic core material. The effect of the casing is to confine the magnetic field substantially within the casing, and to isolate it from external magnetic fields. It has a suitably high magnetic permeability ($10^3$ to $10^6$ may be found suitable). The effect of the particles is to distort the magnetic field lines. Due to the non-uniformity of the distribution of the particles, the field lines are irregular in shape. Magnetic properties measured by the sensors will generally be different at each of the sensors, as described above. Any attempt to remove the outer shield will itself change the distribution of the magnetic field and therefore make it impossible to read the key.

A disadvantage of the known integrated circuit is that it constitutes a rather complex solution to data security, and that it is particularly not suitable for use in bank cards.

SUMMARY OF THE INVENTION

It is an object of the invention to provide an integrated circuit featuring a first level of security against external attack, which is less complex than the known integrated circuit, and which is particularly suitable for use in bank cards.

The invention is defined by the independent claims. The dependent claims define advantageous embodiments.

In a first aspect, the invention relates to an integrated circuit comprising:
a substrate having a first side and a second opposing side;
an electronic circuit provided at the first side of the substrate, wherein the electronic circuit comprises at least one magnetic field sensor, and
a magnetizable region provided on the second side of the substrate by using a deposition processing step, a magnetic moment of the magnetizable region being configurable for generating a magnetic field detectable at the location of the at least one magnetic field sensor.

The effect of the features of the integrated circuit according to the invention is that a very simple construction is achieved. All what is needed is a magnetizable region on the second side and at least one magnetic field sensor on the first side of the substrate. Above that, these additional features can be provided on the substrate using deposition processing techniques which enables a strongly miniaturized solution which is, because of its reduced dimensions well suitable for being used in bank cards. An attempt to remove the integrated circuit according to the invention from its environment (e.g. a bank card or a package) may result in the magnetizable region getting damaged (partially removed) or even completely removed. In case the magnetizable region has been magnetized (such that it has a magnetic moment that results in a magnetic field detectable at the location of the at least one magnetic field sensor) this damaging or removal may be detected by the at least one magnetic field sensor which provides a first level of security against external attack.

The known integrated circuit device, on the other hand, requires a rather complex structure. In the known integrated circuit device the substrate is embedded between two resin layers that comprise magnetic particles having different sizes, shapes and/or magnetic permeabilities. On top of that, the known integrated circuit device comprises two permanent magnets which embed the integrated circuit device, and the stack formed by the magnets, the resin and the substrate is fully encapsulated by a casing having a soft magnetic core material, which confines the magnetic field substantially within the casing. In other words, quite a few additional components are needed for protecting the known integrated circuit device. Above that these features, the casing, the magnets, and the resin with the particles can not be provided using lithographic techniques. Instead, these features are provided at the packaging stage. Further, because of its dimensions, the known integrated circuit device does not properly fit into a standard bank cards. Bank cards like smartcards are typically 950 microns thick, wherein the chip and its support have a typical total thickness of 300 microns. This already indicates that there is little room for additional components. Moreover, the fully encapsulated structure of US2001/003302 complicates contacting circuitry on the substrate.

In this description, with deposition processing step it is meant conventional wafer-level type deposition processing steps like: sputtering, chemical vapor deposition (CVD), low-pressure chemical vapor deposition (LPCVD), plasma enhanced chemical vapor deposition (PECVD), spin coating, spray coating, or atomic layer deposition (ALD). What is explicitly not meant with deposition processing steps are steps that are only possible in a packaging stage of a manufacturing process like mounting with an adhesive layer (e.g. a glue, a resin or a solder material).

In an embodiment of the integrated circuit according to the invention the at least one magnetic field sensor comprises a plurality of magnetic field sensors, each magnetic field sensor of the plurality of sensors being arranged for locally sensing the magnetic field at the first side. Magnetic field sensors generally have a local detection range. Damaging the magnetizable region outside this range may then not be detected. The provision of multiple sensors on the substrate enlarges the overall detection range and thus the security level of the integrated circuit.

In a further embodiment of the integrated circuit according to the invention the magnetizable region is arranged for generating the magnetic field such that it is non-uniform at the location of the electronic circuit at the first side. The advantage of this embodiment is that a designer may place the magnetic field sensors in a specific field of his choice (in terms of magnetic field direction and/or magnetic field strength).

In yet a further embodiment of the integrated circuit according to the invention the plurality of magnetic field sensors is positioned in locations at the first side with a different local magnetic field. In this embodiment the plurality of magnetic field sensors may be arranged to sense different magnetic fields (in terms of magnetic field direction and/or magnetic field strength). Alternative, a selection out of the plurality of magnetic field sensors may be selected to obtain a subset which senses different magnetic fields. In any case, this feature opens up the possibility of assigning a unique identification code or a specific key code to the integrated circuit using output values on outputs of the plurality of magnetic field sensors (eventually digitized).

In a first variant on last mentioned embodiment of the integrated circuit according to the invention the magnetizable region comprises a plurality of magnetization domains having a predetermined magnetization pattern for generating predetermined magnetic fields at the location of the sensors at the first side. The predetermined magnetization pattern may be provided after manufacturing of the magnetizable region on the second side of the substrate by putting the integrated circuit in an external magnetic field (e.g. by means of a permanent magnet or a current-conducting coil). In this way a certain magnetization pattern may be provided in the magnetizable region, which produces the predetermined (deterministic) magnetic fields at the location of the sensors at the first side. These predetermined magnetic fields may be used to produce output signals on outputs of the sensors signals that represent an identification code (chip-ID) or a key code.

In another variant on the before-last mentioned embodiment of the integrated circuit the magnetizable region comprises a plurality of magnetization domains having a random magnetization pattern for generating random magnetic fields at the location of the sensors at the first side. The manufacturing of magnetic materials is well known to the person skilled in the art. Also, it is well-known how to manufacture materials such that a random magnetization pattern occurs. With "random magnetization pattern" it is meant that the magnetization pattern consists of domains having a random position, size, or orientation, when considering a plurality of integrated circuits manufactured in one or more batches for example. Once, the magnetizable region has a such random magnetization pattern, it has become virtually impossible to reproduce such magnetizable region. In other words, a physically uncloneable function, hereinafter referred to as PUF, is obtained. PUF's are used in many applications, but in general a PUF enables, next to fingerprinting of the integrated circuits, also the generation of secret keys which can be used in cryptographic protocols.

In an embodiment of the integrated circuit according to the invention the magnetizable region is opaque for at least infrared and visible light. Preferably, in last mentioned embodiment the magnetizable region and the electronic circuit are positioned with respect to each other such that light incident on the second side is blocked by the magnetizable region. When the magnetizable region is opaque for at least infrared and visible light and when the magnetizable region and the electronic circuit are positioned with respect to each other in the above described way, a higher security level is obtained. Optical inspection methods from the back-side have been rendered virtually impossible without removing the magnetizable layer. However, such removal would inevitable be detected by the at least one magnetic fields sensors, which may be used to clear the secure contents in the electronic circuit. Alternatively, it may be used to deactivate or reset the electronic circuit. The embodiment here described thus provides for a more tamper-resistant integrated circuit.

In an embodiment the magnetizable region overlaps with the electronic circuit when viewed in a direction perpendicular to the substrate. In a further embodiment the magnetizable region fully covers the second side. The latter embodiment provides for the simplest structure. No patterning steps are required after provision of the magnetizable region.

In an embodiment of the integrated circuit according to the invention the substrate comprises, at the second side thereof, a protective layer that is opaque for at least infrared and visible light. The protective layer is sandwiched between the magnetizable region and a remaining part of the substrate. An advantage of this layer is that it renders optical inspection methods from the back-side virtually impossible without removing both the magnetizable region and the protective layer itself. However, the removal of the magnetizable region would inevitably be detected by the at least one magnetic fields sensors, which may be used to clear the secure contents in the electronic circuit. Alternatively, it may be used to deactivate or reset the electronic circuit. The embodiment here described thus provides for a more tamper-resistant integrated circuit. This embodiment may be combined with the embodiment incorporating a magnetizable region that is opaque for at least infrared and visible light.

In a first group of embodiments of the integrated circuit according to the invention, the magnetizable region is arranged for generating a magnetic field having a lateral magnetic field component at the location of the electronic circuit that runs parallel to the first side of the substrate, and wherein the at least one magnetic field sensor is sensitive to the lateral magnetic field component.

In a second group of embodiments of the integrated circuit according to the invention, the magnetizable region is arranged for generating a magnetic field having a vertical magnetic field component at the location of the electronic circuit that runs perpendicular to the first side of the substrate, and wherein at least one the magnetic field sensor is sensitive to the vertical magnetic field component.

The first group and the second group of embodiments may be combined. In that case the magnetic field at the location of the electronic circuit has both a lateral magnetic field component as well as a vertical magnetic field component. In that case a combination of a magnetic field sensor that is sensitive to the lateral magnetic field component and a magnetic field sensor that is sensitive to the vertical magnetic field component may be used. In further embodiments this feature is exploited to create more variation in read-out of the magnetic field sensors.

In an embodiment of the integrated circuit according to the invention the at least one magnetic field sensor is formed by a transistor of which a first electrode is split into a first and second region each carrying a detection current in case of detection, and wherein a difference between the detection currents through the first and second regions is indicative for the magnetic field. It has turned out that the use of such a modified transistor as a sensor provides reliable results, and allows integration of the sensor into an integrated circuit. Particularly, the sensor may be made with CMOS compatible technology.

The transistor may be a MOS transistor. In that case, the drain electrode is split into a first and region each carrying a detection current.

Preferably, the transistor is a bipolar transistor with an emitter, base and collector. In that case, the collector is split into a first and second collector region each carrying a detection current. Herein, the first and second collector regions, the base region, and the emitter region are positioned with respect to each other such that, in operation, a part of an emitter current that traverses the base region is distributed over the first and second collector regions obtaining the first and the second detection current. The use of this bipolar transistor as magnetic field sensor with a split-collector configuration enables a high linearity and a high sensitivity.

More specifically, a difference between the first and second detection currents is determined by a magnetic field component ($B_x$, $B_z$) perpendicular to a current plane, wherein the current plane is defined through the emitter region, the base region and the first and second collector regions and extends in directions defined by the emitter current and the first and second detection currents.

In a very advantageous implementation the semiconductor layer comprises a buried N-well extending in directions parallel to the first side of the substrate, and the emitter region is located at the first side above the buried N-well. This implementation is advantageous because the at least one magnetic field sensor now constitutes a bipolar magneto-transistor structure which is compatible with triple-well technology. The compatibility of the magnetic field sensor with triple-well technology also resides in the presence of a buried N-well underneath the emitter region. A triple-well is in itself an available process option in CMOS technology in process node of 0.18 microns and beyond.

In an embodiment of the integrated circuit according to the invention the current plane extends in a direction perpendicular to the first side of the substrate. This is suitably enabled in that the collector regions are formed in the buried N-well, and the base region is a p-type semiconductor and the emitter region is n-type semiconductor. The magnetic field sensor in this embodiment constitutes a vertical bipolar npn magneto-transistor structure which has the advantage that it is sensitive to fields parallel to the first side of the substrate. This embodiment relies on the insight that the buried N-well in a triple-well CMOS technology, which normally is used for isolation of P-wells in a semiconductor device, can be used as a current path for the collector current of a bipolar transistor.

In an embodiment of the integrated circuit according to the invention the buried N-well comprises two parts separated in a direction parallel to the first side by a separating region of the substrate, the two parts forming the first and second collector regions. This embodiment is advantageous because the magnetic field sensor features control of the distribution of the emitter current that traverses the base region, over the first and second collector regions.

In an embodiment of the integrated circuit according to the invention the separating region of the semiconductor substrate is centrally aligned with the emitter region when viewed from a direction perpendicular to the substrate. The magnetic field sensor in this embodiment features an equal distribution of the emitter current that traverses the base region, over the first and second collector regions.

In an embodiment of the integrated circuit according to the invention the separating region of the semiconductor substrate and the emitter region are centrally offset with a predefined distance when viewed from a direction perpendicular to the substrate. The amount of offset determines the distribution of the emitter current that traverses the base region over the collector regions. The more the separating region is located at the side of the first collector region, the more the emitter current that traverses the base region flows to the second collector region, and vice versa.

In an embodiment of the integrated circuit according to the invention the at least one magnetic field sensor further comprises n-type contact regions extending from the first side to the collector regions in the buried N-well for featuring electrical connects from the collector regions to a circuit. The n-type contact regions may be placed at any suitable position as long as its position with respect to the emitter region and the base region is such that it does not influence the current distribution. This basically means that it should not be too close to the emitter region. Also, preferably, the contact regions should be placed at equal distance from the emitter region so as to assure a more equal current distribution.

In an embodiment of the integrated circuit according to the invention the at least one magnetic field sensor further comprises a third collector region and a fourth collector region of the second conductivity type, the third and fourth collector region forming part of the collector of the bipolar transistor, wherein the third and fourth collector region, the base region, and the emitter region are positioned with respect to each other such that, in operation, a part of an emitter current that traverses the base region is also distributed over the third and fourth collector regions obtaining a third and a fourth collector current, wherein a difference between the third and fourth collector currents is determined by a further magnetic field component perpendicular to a further current plane that extends in a direction perpendicular to the first side of the substrate, wherein the further current plane is defined through the emitter region, the base region and third and fourth collector regions and extends in directions defined by flow directions of the emitter current and the third and fourth collector currents.

The magnetic field sensor in this embodiment effectively constitutes a 2-in-1 magnetic field sensor which advantageously features a 2-dimensional magnetic field direction measurement, which allows for more possible read-outs of the magnetic field sensor given a certain magnetization pattern of the magnetizable region. A first magnetic field component is measured by the first and second collector regions, perpendicular to the current plane, and a second magnetic field component is measured by the third and fourth collector regions, in a direction perpendicular to the further current plane.

In an embodiment of the integrated circuit according to the invention the current plane and the further plane are perpendicular with respect to each other. In such a configuration the actual magnetic field direction can be determined from the two field-vector components measured by the collector regions.

In an embodiment of the integrated circuit according to the invention the collector regions, the base region, and the emitter region are located at the first side above the buried N-well and positioned with respect to each other in a direction parallel to the first side. The magnetic field sensor in this embodiment constitutes a lateral bipolar magneto-transistor structure which has the advantage that it is sensitive to fields perpendicular to the first side of the substrate. This magnetic field sensor is very advantageous when used in combination with a vertical bipolar magneto-transistor structure or a 2-in-1 2-dimensional magnetic field sensor, which features a 2D magnetic field measurement (in a plane perpendicular to the first side of the substrate) and a 3D magnetic field measurement respectively.

In an embodiment of the integrated circuit according to the invention the collector regions and the emitter region of the second conductivity type are formed in the base region of the first conductivity type. This embodiment features the application of additional drift fields or Hall fields in the base region.

In a first variant of last mentioned embodiment the base region comprises two base contact regions of the first conductivity type but having a higher dopant concentration, a first one of the two base contact regions being positioned on a side of the emitter region opposite to a side facing the collector regions, and a second one of the two base contact regions being positioned on a side of the collector regions opposite to a side facing the emitter region. The structure at the first side of the substrate thus obtained constitutes a lateral drift-aided bipolar magnetotransistor in triple-well CMOS technology, which is sensitive to vertical magnetic field components.

In a second variant the base region comprises two base contact regions of the first conductivity type but having a higher dopant concentration, a first one of the two base contact regions being positioned on a side of the emitter region facing the collector regions, and a second one of the two base contact regions being positioned on an opposing side of the emitter region. The structure at the first side of the substrate thus obtained constitutes a lateral bipolar magnetotransistor with injection modulation in triple-well CMOS technology, which is sensitive to vertical magnetic field components.

Preferably in the earlier mentioned embodiments having a bipolar magnetotransistor, the electronic circuit at least comprises CMOS circuitry. CMOS circuitry is fully compatible with triple-well technology and this embodiment thus features easy integration of the magnetotransistor (which is compatible with triple-well technology) with the electronic circuit. This particularly allows the integration of the sensor with an A/D converter. In that manner, the distance for transmitting analog signals within the integrated circuit can be kept short. That is relevant in order to detect small differences in detection currents.

As an alternative to the use of a transistor as the magnetic field sensor, an orthogonal Hall sensor may be used thereto. Such a Hall sensor comprises a source, a drain, and a channel region in between, and further comprising a pair of Hall voltage contacts along sides of its channel region, wherein during operation a voltage difference between the Hall voltage contacts is indicative for the magnetic field sensed by the magnetic field sensor.

In an embodiment of the integrated circuit according to the invention the electronic circuit comprises a memory for storing digital data. Data which needs to be stored in the memory may be any subset out of the following: data to be protected against hacking, a security key, a fingerprint, and the like. The memory is preferably one-time programmable, such as EPROMs. However, it could be another conventional memory element as well, including EEPROM, DRAM, SRAM and MRAM.

In a second aspect the invention relates to a card provided with an integrated circuit in accordance with the invention. Such a card will not work after (partial) removal/damaging of the magnetizable region of the integrated circuit. Such (partial) removal/damaging may already happen when the integrated circuit is removed from the card. Before any operation of the card the authenticity of the integrated circuit may be checked, which will be further explained in detail when discussing the method of checking the authenticity according to the invention. As the actual value of the of the magnetic field of the at least one magnetic field sensor can be compared with the first reference value that is stored, it is in effect impossible to remove or damage the magnetizable region without the magnetic field sensor detecting such event. Therefore, the card that includes the integrated circuit of the invention can be detected to be not authentic anymore after (partial) removal of the magnetizable region.

The card of the invention is preferably a smartcard containing any financial or private data or giving access to any building or information. For such smartcards the safety requirements show a steady increase, which is related to the increasing confidence and use of these smartcards. Alternatively, the card may be a transponder-type of card that can be read out contactlessly. The card can be a banknote as well. In this case the integrated circuit must be very thin. Another type of a card is a SIM-card for a mobile phone. In case of contactless readout the card will contain an antenna to communicate with the access device. The electronic circuit in the integrated circuit is then connected to said antenna.

The magnetic field measured by the at least one magnetic field sensor in the integrated circuit in accordance with the invention can be unpredictable. Therefore, there is a need for a method of initializing the integrated circuit.

In a third aspect the invention relates to a method of initializing an integrated circuit in accordance with the invention. This method comprises steps of:

determining an actual value of the magnetic field at the location of one of the at least one magnetic field sensor, and storing the actual value as a first reference value.

It is important that an actual value of the magnetic field is stored as a first reference value so as to be able to detect any change in magnetic field later on. This method is not limited to a semiconductor device with a passivation structure of which the impedance is really unpredictable. In certain application it can be that the integrated circuit needs re-initialization under certain circumstances, for example in reuse applications this is preferable, however, this may be at the price of a lower security level. Re-use can be advantageous for example in the context of the use of integrated circuits according to the invention for giving access to a building. It is being recognized that before storing the actual value as first reference value, it could be modified according an algorithm. For example, the actual value could be multiplied with an integer value, so as to create a value that is in the range between 0 and 1000. Also, the actual value could be modified, so as to create an integer, or it could be digitalized.

A further embodiment of the method of initializing the integrated circuit comprises, before the step of determining an actual value, a further step of:

configuring the magnetizable region for generating a magnetic field detectable at the location of a further one of the at least one magnetic field sensor. This method is especially required in applications where the magnetizable region is magnetized after manufacturing.

In a fourth aspect the invention relates to a method of checking the authenticity of an integrated circuit in accordance with the invention, after that the integrated circuit has been initialized by the method of initializing according to the invention. This method comprises steps of:

measuring an first actual value of the magnetic field at the location of one of the at least one sensor;

receiving the first reference value;

comparing the first reference value and the first actual value, and recognizing the authenticity of the integrated circuit only, if the difference between the first actual value and the first reference value is smaller than a predefined threshold value.

Once the authenticity of the integrated circuit has been positively verified any further operation may be performed. In case the authenticity of the integrated circuit has been determined as false, the integrated circuit may be reset or any specific content may be deleted which prevents a hacker from gaining access to the secure contents of the integrated circuit.

It is being recognized that before comparing the actual value with the first reference value, it can be modified according an algorithm. For example, the actual value can be multiplied with an integer value, so as to create a value that is in the range between 0 and 1000. Also, the actual value can modified, so as to create an integer, or it could be digitalized. If there is a modifying algorithm, it will be implemented in the semiconductor device, such that it cannot be adapted. In this way it is assured that the actual value and the first reference value are modified in the same way.

These and other aspects of the invention are apparent from and will be elucidated with reference to the embodiments described hereinafter.

DETAILED DESCRIPTION OF THE PREFERRED EMBODIMENT

Figure 1:
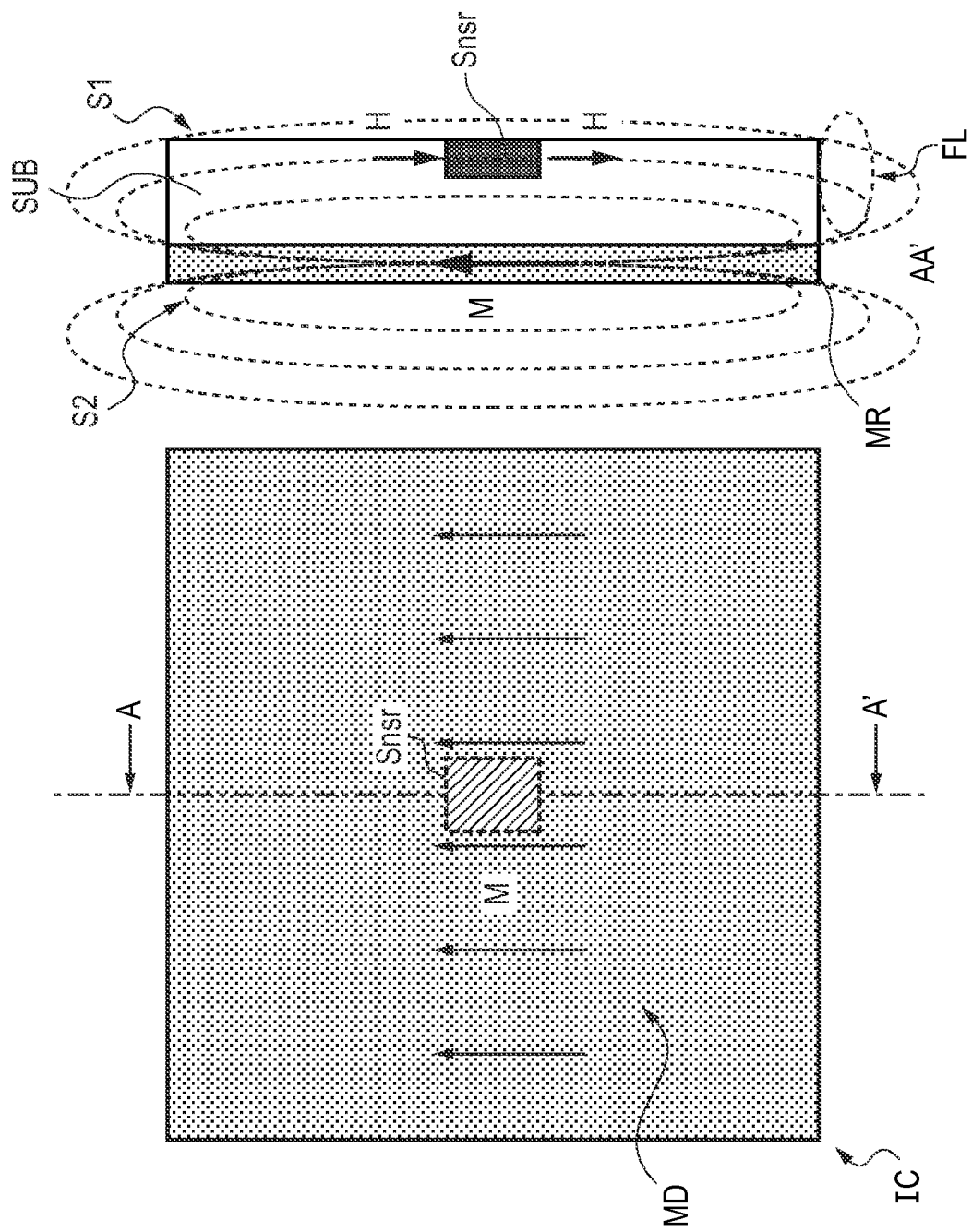
FIG. 1 shows a schematic top-view and a schematic cross-sectional view of an integrated circuit in accordance with a first embodiment of the invention.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage. Throughout the Figures, similar or corresponding features are indicated by same reference numerals or labels.

As described earlier in this specification there is an increasing need to protect IC's against physical attacks which aim at retrieving data there from. Physical attacks from the back side of an IC are becoming an increasingly important threat for IC's, and especially for bank cards. Although in the prior various schemes for back-side protection of IC's are proposed, these schemes constitute complex and costly solutions. Above that, the known schemes are, due to their complexity, not compatible with conventional lithography and must be carried out in later stages of the manufacturing process.

In this description the "front-side" of a semiconductor device is defined as the side of the semiconductor device on which circuitry is provided. This side is also being referred to as the "first side of the substrate" in this description. Likewise, the "back-side" of the semiconductor device is defined as the side opposite to the front-side and this side is also being referred to as the "second side of the substrate" in this description.

Where in this application it is mentioned that a magnetic field is "detectable" it is meant that it should locally at least exceed the value of any background magnetic field (such as the earth magnetic field) and preferably it should exceed this by a factor of ten. It is difficult to specify what the real lower limit is. First of all, in case the background magnetic field is the earth magnetic field, its strength and direction heavily depend on geographical location, altitude, etc. Secondly, it depends on the sensitivity of the magnetic field sensor used and eventual peripheral circuitry around it that is arranged to compensate for low signal-to-noise ratios. It is considered to fall within the normal means and the capacity for routine work and experimentation of the skilled person to come up with a functioning magnetic field sensor for a specific background magnetic field.

Where in this application the word "substrate" is mentioned, it is meant the substrate and everything that is integrated therein by means of wafer-level type deposition processing steps including steps like: chemical vapor deposition (CVD), low-pressure chemical vapor deposition (LPCVD), physical vapor deposition (sputtering), spin coating, spray coating, atomic layer deposition (ALD), or plasma-enhanced chemical vapor deposition (PECVD). What is not considered as being part of the substrate is a substrate carrier (e.g. a leadframe of a package), an adhesive layer (a resin, a glue, solder material) used for mounting the substrate to a further part like a package or the substrate carrier.

FIG. 1 shows a schematic top-view and a schematic cross-sectional view of an integrated circuit in accordance with a first embodiment of the invention. The cross-sectional view on the right-hand side of the Figure is taken at line AA' in the top-view on the left-hand side of the Figure. The integrated circuit IC comprises a substrate SUB having a first side S1 (front-side) and a second side S2 (back-side). On the first side S1 an electronic circuit (not shown) is provided. The electronic circuit comprises a magnetic field sensor Snsr. On the second side S2 of the substrate SUB a magnetizable region MR has been provided by means of a wafer-level type deposition processing step.

A magnetizable material like neodymium-iron-boron (Nd-FeB) or cobalt-platinum (CoPt) can be deposited on the second side S2 of the substrate SUB by means of a sputtering step. This can be done from a homogeneous target of these materials in a DC or RF type sputtering system in Argon (Ar) at a pressure of typically 1-20 mTorr. The magnetization takes place outside the sputtering system in either a homogeneous magnetic field (to obtain one, single, homogeneously magnetized domain) or by defining smaller, sub-chip scale regions by moving a smaller magnetization device (yoke) over the as-deposited film. By making this movement virtually random, a random distribution of magnetization domains can be obtained.

The magnetizable region MR is arranged such that it has sufficient coercivity and remanent magnetization to keep some magnetic "information" in it. Any magnetic information may then create a stray field which may be detected by the magnetic field sensor Snsr at the front side S1 of the integrated circuit IC. In FIG. 1 the magnetizable region MR is provided with one magnetization domain MD having a magnetic moment M. Expressed differently, a magnetization domain is defined as a domain having a magnetization in one predominant direction. In this example the magnetic moment M is in directed in a direction parallel to the first side S1 of the substrate SUB. The magnetization domain MD may cover the full back-side S2 of the substrate SUB. The magnetic moment M of the magnetization domain MD is chosen such that a magnetic field H at location of the magnetic field sensor Snsr is detectable. In the cross-sectional view in FIG. 1 a couple of magnetic field lines FL are shown for illustrative purposes only. In reality the field lines FL may follow different paths than illustrated here. What is essential though is that the local magnetic field H at the location of the magnetic field sensor Snsr exceeds a certain minimum value such that it is detectable. This minimum value is also dependent on any background magnetic field which may be present. Obviously, measures could be taken to shield the integrated circuit IC from external magnetic fields. This may be done in the package of the integrated circuit IC, but increases the costs of integrated circuit IC. A resulting lower background magnetic field means that the lower limit of what is detectable may shift to lower magnetic field strengths. However, in that case the sensitivity of the magnetic field sensor Snsr may become the limiting factor.

In FIG. 1 the magnetic field sensor Snsr is placed in the middle of the integrated circuit IC which is for illustrative purposes only. Alternatively, the magnetic field sensor Snsr may be placed in any other location where there is a detectable magnetic field H. Further, the magnetic field sensor Snsr is provided adjacent to a surface at the first side S1. However, it may also be provided at a distance from the surface at the second side S2 of the substrate SUB. This is for instance the case if the integrated circuit IC comprises interconnection layers (not shown) and dielectrics (including a passivation layer) on top of components like transistors, capacitance, resistances, and inductances which form part of the electronic circuit. In this description, the wording "at the first side" is by no way intended to be restricted to "at the surface".

In FIG. 1 the magnetizable region MR is arranged for generating a magnetic field having mainly a lateral magnetic field component H at the location of the electronic circuit that runs parallel to the first side S1 of the substrate SUB. In accordance with this, the magnetic field sensor Snsr should be sensitive to the lateral magnetic field component. In alternative embodiments the magnetizable region MR is arranged for generating a magnetic field having a vertical magnetic field component at the location of the electronic circuit that runs perpendicular to the first side S1 of the substrate SUB. Analogously, the magnetic field sensor Snsr should be sensitive to the vertical magnetic field component. In further embodiments both concepts are mixed.

An attempt to remove the integrated circuit IC of FIG. 1 from its environment (e.g. a bank card or a package) may result in the magnetizable region MR getting damaged (partially removed) or even completely removed. This damaging or removal results in a change in the generated magnetic field and may be detected by the magnetic field sensor Snsr. After detection any appropriate action may be initiated (reset, erase of contents, self-destruction by blowing up fuse links, etc) which provides a first level of security against external attack. The magnetic field sensor Snsr may comprise analog to digital conversion means (AD converter) for producing digital output bits.

Figure 2:
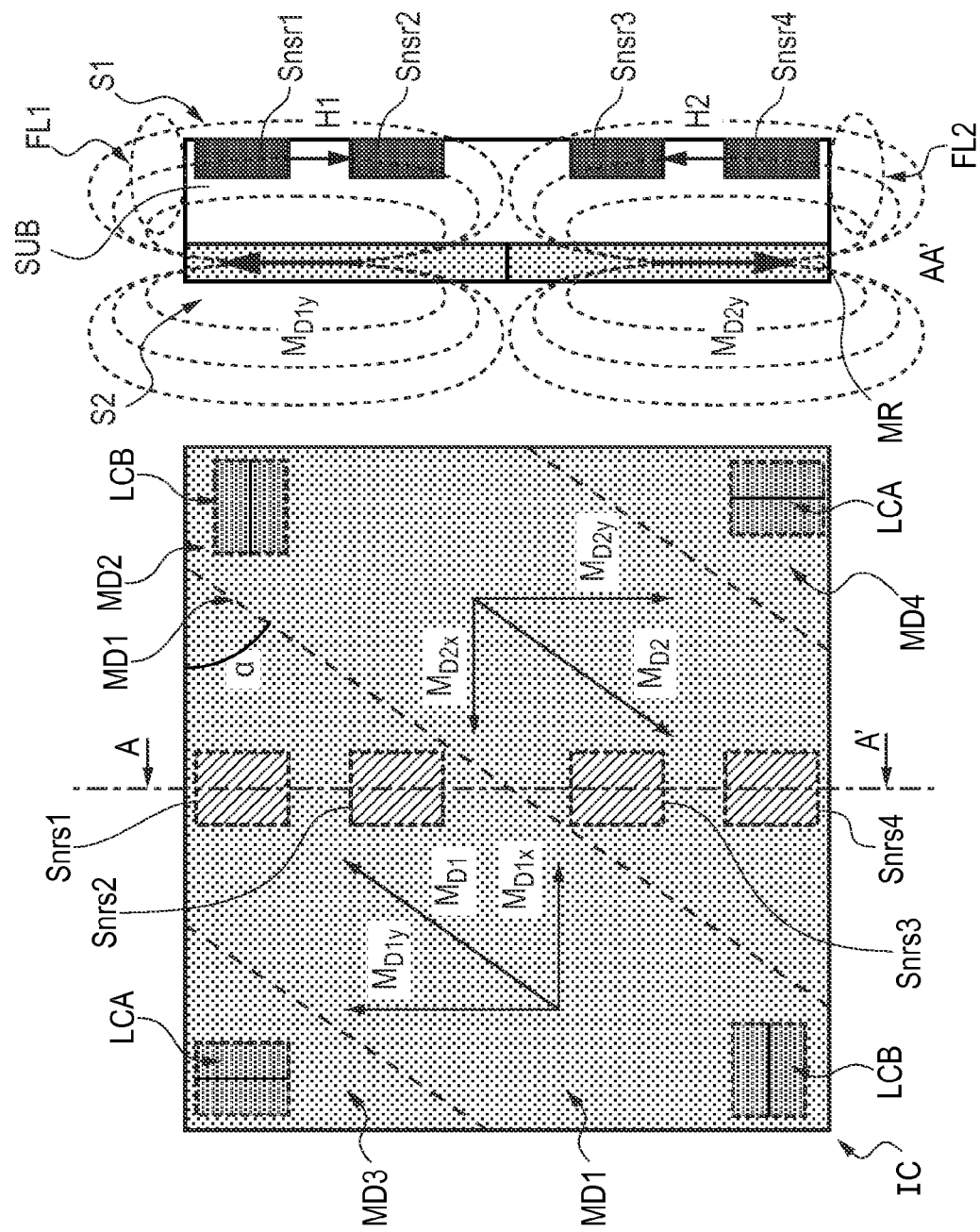
FIG. 2 shows a schematic top-view and a schematic cross-sectional view of an integrated circuit in accordance with a second embodiment of the invention.

FIG. 2 shows a schematic top-view and a schematic cross-sectional view of an integrated circuit in accordance with a second embodiment of the invention. The cross-sectional view on the right-hand side of the Figure is taken at line AA' in the top-view on the left-hand side of the Figure. In this embodiment of the integrated circuit IC the magnetic region MR is provided with four magnetization domains MD1, MD2, MD3, MD4, wherein each magnetization domain has a different magnetic moment M. A first one MD1 of the magnetization domains has a first magnetic moment $M_{D1}$ in a first direction, and a second one MD2 of the magnetization domains has a second magnetic moment $M_{D2}$ in a second direction opposite to the first direction. Between the first magnetization domain MD1 and the second magnetization domain MD2 there is an interface MDI having a varying direction of magnetization. This interface is also called a domain wall. In this example the interface MDI follows a straight line that makes an angle $\alpha$ with an edge of the substrate SUB. In other embodiments the interface may follow other curves and/or the interface may make a different angle with the edge of the substrate SUB.

At the first side S1 of the substrate an array of four magnetic field sensors Snsr1, Snsr2, Snsr3, Snsr4 have been provided. Just as in the embodiment of FIG. 1 the magnetic field sensors may comprise analog to digital conversion means (AD converter) for producing digital output bits. In the cross-sectional view in FIG. 2 a couple of magnetic field lines FL1 generated by the first magnetization domain MD1 and a couple of magnetic field lines FL2 generated by the second magnetization domain MD2 are shown. These magnetic field lines FL1, FL2 are shown for illustrative purposes only. In reality the field lines FL1, FL2 may follow different paths as illustrated here. What is essential though is that the local magnetic fields H1, H2 at the locations of the magnetic field sensors Snsr1, Snsr2, Snsr3, Snsr4 exceed a certain minimum value such that it is detectable. The first and second magnetic field sensor Snr1, Snsr2 have been placed in a magnetic field generated by the first magnetization domain MD1. The third and fourth magnetic field sensor Snsr3, Snsr4 have been placed in a magnetic field generated by the second magnetization domain MD2. The orientation of the magnetic field sensors Snsr1, Snsr2, Snsr3, Snsr4 is such that they are sensitive for magnetic field components extending in a direction of cross-sectional line AA' in FIG. 2 and parallel to the first side S1 of the substrate SUB. The local magnetic fields H1, H2 sensed by the magnetic field sensors Snsr1, Snsr2, Snsr3, Snsr4 are determined by, amongst other parameters (like the location of the sensors in the inhomogeneous magnetic field), the components of the magnetic moments $M_{D1y}$, $M_{D2y}$ in the direction of cross-sectional line AA' in FIG. 2 and parallel to the first side S1 of the substrate SUB.

Similarly as to the embodiment illustrated in FIG. 1, an attempt to remove the integrated circuit IC of FIG. 2 from its environment (e.g. a bank card or a package) may result in the magnetizable region MR getting damaged (partially removed) or even completely removed. This damaging or removal results in a change in the generated magnetic field and may be detected by one of the magnetic field sensors Snsr1, Snsr2, Snsr3, Snsr4. After detection any appropriate action may be initiated (reset, erase of contents, self-destruction by blowing up fuse links, etc) which provides a first level of security against external attack. Magnetic field sensors generally have a local detection range. Damaging the magnetizable region outside this range may then not be detected. The provision of more magnetic field sensors on the substrate in FIG. 2 enlarges the overall detection range and thus the security level of the integrated circuit IC. In FIG. 2, for illustration purposes, additional sensors have been added in corner locations LCA. Also, for illustrating the design freedom of a designer, in further corner locations LCB of the integrated circuit further additional sensors have been provided, which are sensitive to further magnetic field components $M_{D1x}$, $M_{D2x}$ perpendicular to the magnetic field components $M_{D1y}$, $M_{D2y}$.

When the magnetic field sensors Snsr1, Snsr2, Snsr3, Snsr4 are positioned in different magnetic fields H1, H2 this may result in a different read-out for each of the magnetic field sensors Snsr1, Snsr2, Snsr3, Snsr4. This feature may be exploited for creating a device specific identification code (chip-ID), which may be achieved by properly configuring the magnetizable region MR (number of magnetization domains, magnetic moment of the domains, size of the magnetization domains, etc) and/or by configuring the magnetic field sensor array Snsr1, Snsr2, Snsr3, Snsr4 (the number of magnetic field sensors, the position of the magnetic field sensors, the type/sensitivity of the magnetic field sensors, the orientation of the magnetic field sensors, etc). Using these various parameters, any sequence of desired output values of the magnetic field sensors may be obtained.

The easiest way to obtain a unique chip-ID is to configure the magnetizable region MR with a predetermined magnetization pattern and to incorporate a sufficiently dense array of sensing elements distributed over the first side of the integrated circuit IC. The detection distance is in the order of 100-750 microns (typical thickness of a substrate). A consequence of this is that, in order to achieve the best detection possibilities, the magnetization pattern may not have a too fine pitch (magnetization domains should not be too small).

A very attractive embodiment of the integrated circuit is obtained if the magnetization pattern of the magnetizable region MR is of a random nature in such a way that it cannot be exactly reproduced. The manufacturing of magnetic materials is well known to the person skilled in the art. Also, it is well-known to the person skilled in the art how to manufacture materials such that a random magnetization pattern occurs (see for instance: Robert C. O'Handley (MIT), "*Modern Magnetic Materials. Principles and Applications*.", John Wiley & Sons, Inc, New York).

One may use a magnetization yoke of a particular shape that is alterable in order to obtain a "random" magnetization pattern. The reference mentioned above illustrates that materials exist that possess a random distribution of their magnetization pattern by nature. This is observable e.g. in thin-film single-crystal magnetic garnets (Yttrium Iron Garnet (YIG)) with a perpendicular anisotropy. The domains are visible as a "spaghetti" type of ordering, called stripe domains. For more information on this see also:

"http://psroc.phys.ntu.edu.tw/cjp/ download.php?d=1&pid=1685"

and

"http://depts.washington.edu/kkgroup/publications/PDF/ 2004_Chun_Fe_domain_coup.pdf".

With "random magnetization pattern" it is meant that the magnetization pattern consists of domains having a random position, size, or orientation, when considering a plurality of integrated circuits manufactured in one or more batches for example. Once, the magnetizable region has such random magnetization pattern, it has become virtually impossible to reproduce such magnetizable region. This will then create a Physical Uncloneable Function, from now on being referred to as a PUF.

Recently, so-called Physical Uncloneable Functions (PUFs) were introduced by Pappu "Physical One-Way Functions" MIT, March 2001 as a cost-effective way of generating secure keys for cryptographic purposes. PUF are described for use as a hash function and for authentication purposes. Because through PUFs the data is stored essentially in a material rather than in a circuit, the technology can also be used as part of a device that needs authentication, such as a security sensor. Many further developments focus on developing different types of PUFs. The application of PUFs focuses on using PUFs as unique identifiers for smart-cards and credit cards or as a 'cheap' source for key generation (common randomness) between two parties, see P. Tuyls e.a. "Information-Theoretic Security Analysis of Physical Uncloneable Functions", based on the very useful properties of PUF of the uniqueness of the responses and uncloneability of the PUF.

In case a PUF is used in a system for secure storage of digital data, such a system may comprise:

a data storage (e.g. an embedded memory or a stand-alone memory);

a physical uncloneable function, hereinafter referred to as PUF, including an input for receiving a challenge and an output for producing a response to the challenge;

means for determining an identifier associated with the data storage;

means for supplying a representation of the identifier to the PUF as a challenge and retrieving a corresponding response from the PUF;

a cryptographic unit for performing a cryptographic operation for securing or verifying a digital content item stored in the data storage, where the cryptographic operation is performed under control of a cryptographic key derived from the received response.

In this system, the PUF is used to generate the cryptographic key. The input to the PUF is associated with the data storage. As such, the PUF binds the cryptographic key to the data storage. Since the PUF is uncloneable, cloning of content stored in the data storage becomes useless. The cryptographic operations on the cloned content item will not produce the desired result without the original PUF. The cryptographic operation may be any cryptographic operation, preferably authentication or encryption/decryption.

The integrated circuit IC according to the invention may also be made tamper-resistant by making the magnetizable region MR opaque for at least infrared and visible light.

When the magnetizable region MR is opaque for at least infrared and visible light and when the magnetizable region MR and the electronic circuit are positioned with respect to each other in the above described way, a higher security level is obtained. Optical inspection methods from the back-side S2 have been rendered virtually impossible without removing the magnetizable region MR. However, such removal would inevitable be detected by the magnetic fields sensors Snsr1, Snsr2, Snsr3, Snsr4, which may be used to clear the secure contents in the electronic circuit. Alternatively, it may be used to deactivate or reset the electronic circuit.

Almost every magnetic material is opaque, such as ferrites, metallic magnetic alloys, nanocrystalline materials. Exceptions are some types of garnets, such as Yttrium Iron Garnet (YIG), which are transparent.

Figure 3:
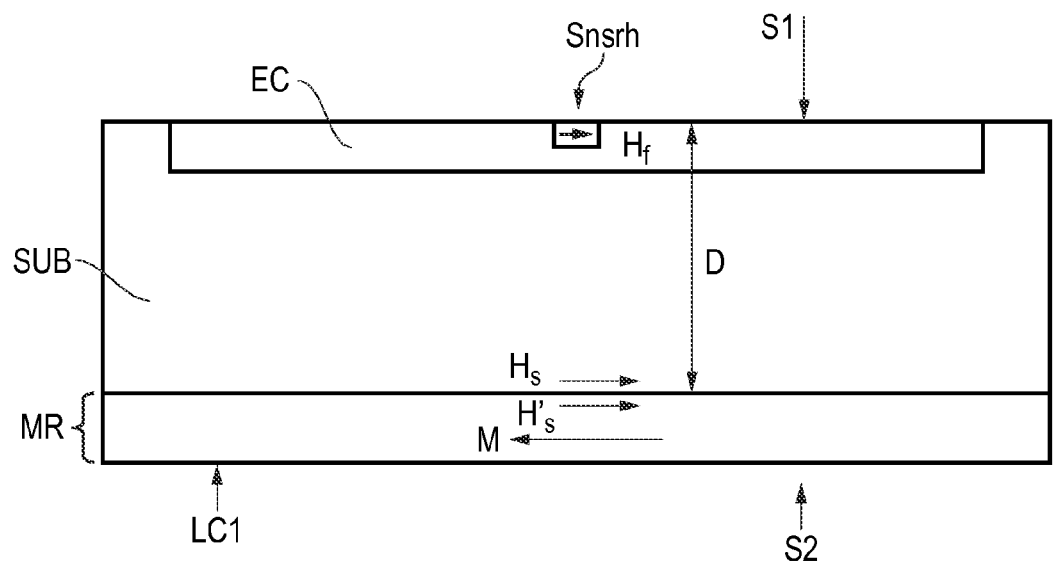
FIG. 3 illustrates the parameters determining the magnetic field detected by the magnetic field sensor at the first side of the substrate for a first example embodiment.
Figure 4:
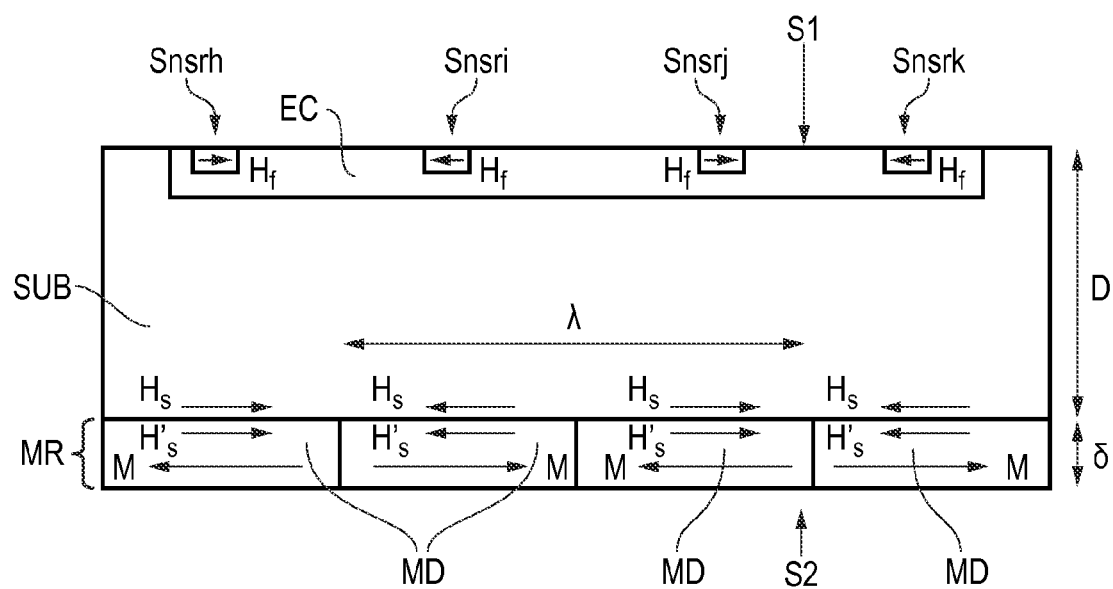
FIG. 4 illustrates the parameters determining the magnetic field detected by the magnetic field sensor at the first side of the substrate for a second example embodiment.

FIG. 3 illustrates the parameters determining the magnetic field detected by the magnetic field sensor Snsrh at the first side S1 of the substrate for a first example embodiment. FIG. 4 illustrates the parameters determining the magnetic field detected by the magnetic field sensors Snsrh, Snsri, Snsrj, Snsrk at the first side S1 of the substrate for a second example embodiment. FIGS. 3 and 4 illustrate two different situations in order to clarify the principle of magnetic detection of the back-side layer. FIG. 3 illustrates a schematic cross-sectional view of an integrated circuit in accordance with an embodiment of the invention, featuring a first level of security against external attack from its second side S2 (back-side). The integrated circuit comprises a substrate SUB having a first side S1 and a second side S2. At the first side S1 of the substrate SUB an electronic circuit EC is provided. The electronic circuit EC comprises a magnetic field sensor Snsrh in accordance with an embodiment of the magnetic field sensor in accordance with the invention, which is sensitive to a magnetic field component $H_f$ that runs parallel to the first side S1 of the substrate SUB. On the second side S2 of the substrate SUB a magnetizable region MR is provided by using a deposition processing step (in this example in the form of a layer covering the second side S2, but it may also cover only part of the second side S2). With deposition processing step it is meant conventional wafer-level type deposition processing steps like: sputtering, chemical vapor deposition (CVD), low-pressure chemical vapor deposition (LPCVD), plasma enhanced chemical vapor deposition (PECVD), spin coating, spray coating, or atomic layer deposition (ALD). What is explicitly not meant with deposition processing steps are steps that are only possible in a packaging stage of a manufacturing process like mounting with an adhesive layer (e.g. a glue, a resin or a solder material).

The magnetizable region MR is provided with a magnetic moment M, which is chosen to be of such value that the magnetic field $H_f$ at the first side S1 is detectable. An attempt to remove the integrated circuit of FIG. 3 from its environment (e.g. a bank card) may result in the magnetizable region MR getting damaged (partially removed) or even completely removed. This damaging or removal may be detected by the magnetic field sensor Snsrh which provides a first level of security against external attack.

FIG. 4 illustrates a schematic cross-sectional view of an integrated circuit, accordance with another embodiment of the invention, featuring a higher level of security against external attack from its second side S2 (back-side). In this embodiment the electronic circuit EC comprises a plurality of magnetic field sensors Snsrh, Snsri, Snsrj, Snsrk. In this embodiment the sensors are sensitive to a magnetic field component $H_f$ that runs parallel to the first side S1 of the substrate SUB. The magnetizable region MR is provided (again by using a deposition processing step) with a plurality of magnetic domains MD each having a specific amplitude and direction of the magnetization vector M. Here, the amplitude is being referred to as the remanent magnetization which is the amplitude of the magnetization vector $\overline{M}$ in the absence of an external magnetic field strength. Due $\overline{\text{to}}$ the hysteretic behaviour of the M-H curve of many magnetic materials, the magnetization vector M will depend on the magnetic history of the material. The plurality of sensors Snsrh, Snsri, Snsrj, Snsrk is placed at the first side S1 such that the sensors sense the field of different magnetic domains MD (in this example one sensor per domain). The remanent magnetization of each magnetic domain MD is chosen to be of such value that the magnetic field $H_f$ at the first side S1 is detectable. An attempt to remove the integrated circuit of FIG. 4 from its environment (e.g. a bank card) may result in the magnetizable region MR getting damaged (partially removed) or even completely removed. This damaging or removal may be detected by the plurality of magnetic field sensors Snsrh, Snsri, Snsrj, Snsrk. Magnetic field sensors generally have a local detection range. Damaging the magnetizable region MR outside this range (e.g. at a first location LC1 in FIG. 3) may then not be detected. The provision of more sensors enlarges the overall detection range and thus the security level of the integrated circuit. The sensors that are distributed over the first side S1 sense different magnetic fields Hf, because of the fact that the magnetizable region MR comprises a plurality of magnetic domains MD each having a different direction of magnetization vector M. In embodiments of the invention this may be exploited to generate a unique identification code for the integrated circuit (by choosing appropriate magnetic domains MD and/or by choosing appropriate locations of the sensors).

Some calculations have been performed in order to determine what magnetic field strengths are detectable. The calculations were meant to provide insight in the required magnetization M of the magnetic layer ML on the second side S2 of the substrate SUB for obtaining a measurable magnetic field Hf component at the first side S1.

In the case of FIG. 3, for ease of calculation, it was assumed that the magnetic region MR attached to the backside S2 of a silicon (Si) substrate, is infinitely wide, and has a magnetic moment M. The magnetic field sensor Snsrh is positioned on the front side S1 of the silicon substrate at a distance D (wherein D is the thickness of the substrate). When the magnetic region MR is (assumed) infinitely wide, a surface magnetic field strength $H'_s$ of the magnetic region MR is zero. On the other side of the magnetic region interface the substrate surface field strength $H_s$ is equal to the surface magnetic field strength $H'_s$ of the magnetic region MR and is also zero. Therefore, it is expected that no field may be detected on the location of sensor Snsrh. A solution to this is to use one magnetic domain having smaller (finite) dimensions or a magnetization pattern of multiple domains. This is illustrated in FIG. 4.

In the case of FIG. 4, for ease of calculation, it is assumed that the magnetic region MR attached to the backside S2 of a silicon (Si) substrate, has a thickness δ, and is provided with a magnetization pattern, wherein there is a plurality of magnetic domains MD, each magnetic domain having a magnetization M different from its neighboring domains. It is assumed that the magnetization pattern follows a square-wave function having a wavelength λ, such that the magnetic domains MD show an alternating direction of magnetization M. The internal surface magnetic field strength $H'_s$ will be $-\alpha/2$ times the value of remanent magnetization. If the thickness δ of the magnetic layer MR is between infinite and λ/2 the factor α is 1. For δ<λ/2 we have α/2=δ/λ. On the other side of the Si-magnet interface the substrate surface field strength $H_s$ equals $H'_s$. Due to distance loss, called spacing loss in the technical field of magnetic recording, the field decay will be exponential, by a factor exp(-kD), where k=2π/λ. Therefore, the field strength at the first side S1 of the substrate SUB, where the magnetic field sensors are located, will be $H_f = H_s \exp(-2\pi D/\lambda)$.

In order to obtain a magnetic field strength $H_f$ which may not easily be disturbed by the earth magnetic field $H_{earth}$, its value is preferably at least a factor of 10 larger than the earth magnetic field $H_{earth}$. This implies a value of the magnetic field strength $H_f$ of at least 400 A/m (=5 Oe). According to Table 6.1 in C. S. Roumenin, *Handbook of Sensors and Actuators, Volume 2, "Solid state magnetic sensors"*, Elsevier, 1994, ISBN 0 444 89401 2, the average equivalent noise magnetic flux density of silicon magnetotransistors is about $2 \times 10^{-5}$ T (5 Hz bandwidth). For $H_f$=400 A/m (or $B_f$=5×$10^{-4}$ T) this implies an S/N ratio of $5 \times 10^{-4}/2 \times 10^{-5}$=25, which seems sufficient.

The required remanent flux density $M_r$ has been calculated for two different examples:

In the first example, it is assumed that $H_f$=400 A/m, $H_s$ may be calculated for given D and λ. Here it is assumed that D=100 μm (which is a realistic value for a smart card IC) and that λ=D. $H_s$ is now calculated as follows: $H_s = H_f \exp(2\pi D/\lambda) = 400 \times 535 = 214$ kA/m (=2677 Oe). If the magnetic layer thickness δ equals 25 μm, or 0.25λ, then α/2=0.25. As $H'_s$ equals $H_s = -(\alpha/2) \cdot M_r$, this requires an $M_r$=856 kA/m (=10800 Oe).

The remanent flux density $B_r = \mu_0 M_r$ would then have to be at least 1 T. This is a value that is achievable for amorphous magnetic materials such as neodymium-iron-boron (NdFeB) alloys, but a factor of 2 larger than the value of the 'best' ferrites known to the inventors at the moment of the invention.

It must be noted that a smaller wavelength λ, a smaller magnet layer thickness δ or a larger substrate thickness D requires higher values of the remanent magnetization $M_r$.

In the second example, the requirement for a high remanent magnetization $M_r$ is released considerably by increasing the wavelength λ. For D=100 μm and λ=2D=200 μm, it is found that $H_s = H_f \exp(2\pi/\lambda) = 400 \times 24 = 9600$ A/m (=120 Oe). If magnetic layer thickness δ equals 10 μm, or 0.05λ, then α/2=0.05. As $|H'_s|$=9600 A/m=0.05$M_r$, this requires an $M_r$=192 kA/m (=2400 Oe).

The remanent flux density $B_r = \mu_0 M_r$ would then have to be at least 0.25 T, which is achievable for ferrite magnets.

Figure 5:
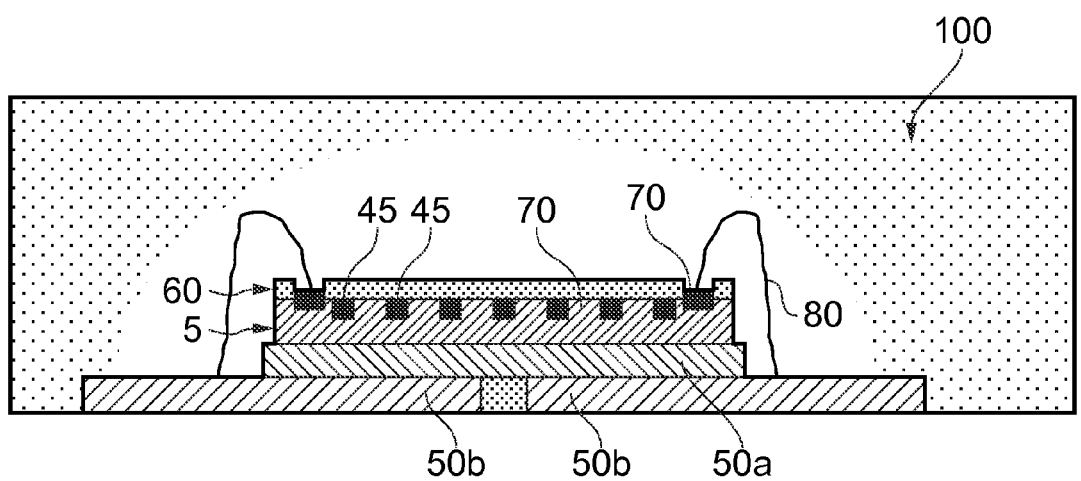
FIG. 5 shows a schematic cross-sectional view of a card comprising an integrated circuit in accordance with the invention.

FIG. 5 shows a schematic cross-sectional view of a card comprising an integrated circuit in accordance with the invention. FIG. 5 shows a schematic cross-sectional view of a card comprising an integrated circuit in accordance with the invention. The card 100 comprises a recess in which an integrated circuit is provided. The integrated circuit comprises a substrate 5. On a front-side of the substrate 5 a plurality of magnetic field sensors 45 is provided, and on a back-side of the substrate 5 a magnetizable layer 50a is provided. The magnetizable layer 50a has been provided with a magnetic moment such that the magnetic field generated by it is detectable at the location of the plurality of magnetic field sensors 45. The substrate 5 is mounted on an electrically-conductive substrate carrier 50b (e.g. with an adhesive layer). The substrate carrier 50b is patterned in separate conductors. The integrated circuit in FIG. 5 is further provided with bond-pads 70 on its front-side which are connected to the substrate carrier 50b via bonding wires 80. The substrate carrier is used to connect the substrate 5 to the outside world via the separate conductors of the electrically-conductive substrate carrier 50b. Also, a passivation layer 60 may be provided over the semiconductor device having holes at locations of the bond-pads 70 which are connected to the substrate carrier 50b. By way of an example application the assembly has been mounted into a plastic card 100 which is the case in smart-card applications for example. In an attempt to remove the integrated circuit from its environment the substrate carrier 50b is removed. While removing the substrate carrier, the magnetizable region 50a may be partially removed (damaged) or completely removed. This removal will influence the magnetic field sensed by the magnetic field sensor. As soon as a magnetic field change is detected (thus a change in authenticity) the integrated circuit takes measures to prevent a hacker to retrieve information stored thereon, e.g. by erasing its contents or by resetting itself. A more secure card is thus obtained.

In an alternative embodiment the substrate carrier 50b is also provided with a magnetic moment. The magnetic field sensed by the magnetic field sensors 45 is then a sum of the magnetic field generated by the magnetizable layer 50a and the substrate carrier 50b. In this embodiment the removal of the integrated circuit from the card 100 is already detected even if the magnetizable region 50a stays fully intact (which may be the case if the hacker operates with extreme care).

Figure 6:
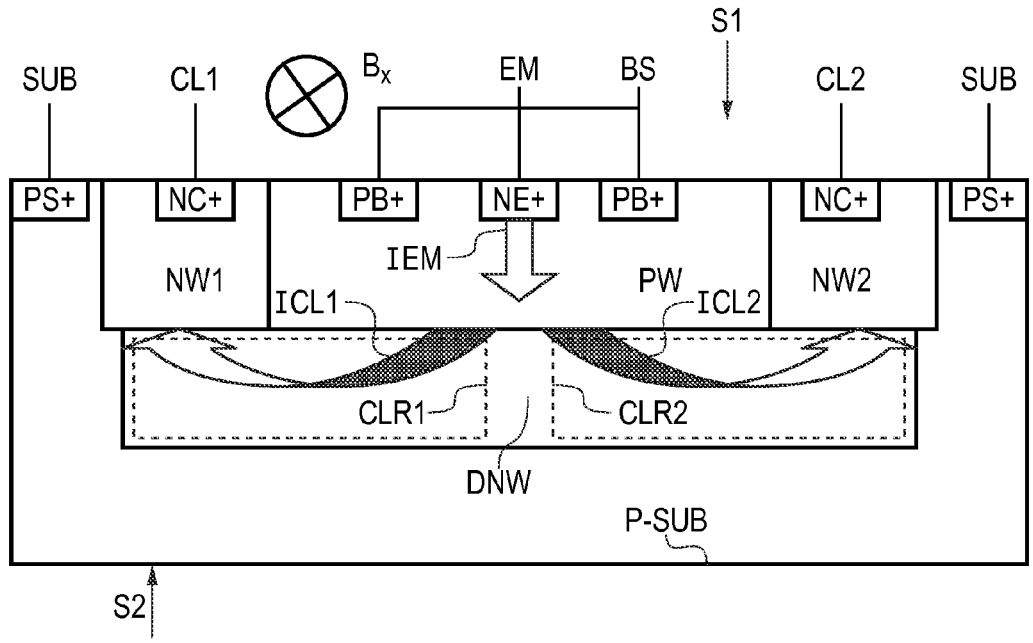
FIG. 6 shows a schematic cross-sectional view of a first embodiment of a magnetic field sensor which may be used in the integrated circuit of the invention.

FIG. 6 shows a schematic cross-sectional view of a first embodiment of a magnetic field sensor which may be used in the integrated circuit of the invention. The magnetic field sensor comprises a p-type silicon comprising substrate P-SUB having a first side S1 (front-side) and a second side S2 (backside). Alternatively, any type of substrate (eg. in silicon-on-anything technology) may be used having a p-type silicon comprising layer provided on top of it. A bipolar (npn) vertical magnetotransistor (VMT) is implemented in the following way. A P-well PW is formed at the first side S1 of the substrate P-SUB of which part forms the base region and acts as a base of the bipolar transistor. The substrate is contacted via substrate contact regions PS+ which are connected to a substrate terminal SUB of the bipolar transistor. In the P-well PW heavily doped p-type contact regions PB+ are formed which are connected to a base terminal BS. In the P-well PW a heavily doped n-type region NE+ is formed which acts as an emitter. The emitter is connected to an emitter terminal EM.

Under the P-well PW a buried N-well DNW is formed which is arranged to act as the collector of the bipolar transistor. The buried N-well DNW is contacted on two opposite sides of the emitter region NE+ by N-well regions NW1, NW2 forming contact regions. The contact regions NW1, NW2 are connected to collector terminals CL1, CL2 via highly-doped n-type regions NC+. This geometry ensures that, during operation of the bipolar transistor, an emitter current IEM that traverses the base region is divided in two collector currents ICL1, ICS2. Effectively, this means that the buried N-well DNW comprises two collector regions CLR1, CLR2 over which the emitter current IEM that traverses the base region is distributed. The geometry may be designed such (in terms of symmetry, dimensions, doping profiles, etc) that in case of a zero magnetic field the collector currents CL1, CL2 are equally large. During operation of the bipolar transistor, an in-plane magnetic field component $B_x$ perpendicular to a current plane (flux density) will cause a differential collector current (or a difference in collector currents ICL1, ICL2) that is proportional to the in-plane flux-density component $B_x$. The current plane is defined as the plane through the emitter region NE+, the base region PW and the collector regions CLR1, CLR2 which extends in directions defined by the flow directions of the emitter current IEM (perpendicular to the first side S1 of the substrate P-SUB) and the collector currents ICL1, ICL2. In the above example, the current plane coincides with the plane of the drawing in FIG. 6.

The magnetic field sensor in FIG. 6 is compatible with triple-well CMOS technology, which is most likely used for all technology nodes of 65 nm and beyond (for more information on triple-well see: "http://www.thresholdsystems.com/news_sr.htm" under Point 2a). The compatibility is caused to a large extend by the buried N-well DNW, the P-well PW, and the N-wells NW1, NW2. It must be stressed, however, that in the prior art, the function of the buried N-well is to electrically isolate P-wells which are located in it. This is done by properly biasing the wells to the right voltage such that pn-junctions are reverse-biased. Such biasing techniques are well-known to the person skilled in the art. This particular embodiment, wherein the buried N-well in a triple-well CMOS technology is used as a current distributor or current divider, is not something a person skilled in the art would consider and is considered to be the insight of the inventors.

The magnetic field sensor in FIG. 6 (but also those discussed later) is a transistor. This features both integration as a separate entity/block in the electronic circuit or it may be combined with another circuit like an analog-to-digital converter for example.

In order to use the magnetic field sensor of the invention circuitry is needed which measures the current difference in order to obtain a value of the magnetic field component perpendicular to the current-plane. One way of measuring the magnetic field sensor's response is to bias it with a constant emitter current source (not shown), to connect the collectors to a current mirror, and to connect one of the collectors to a current-to-voltage converter. It is considered well-known to the person skilled in the art to build such measurement circuitry or to provide alternative ones. In case of the above-mentioned set-up the output will be:

$$\Delta I_C = K \cdot B_x \cdot I_E \cdot \mu_{Hn},$$

wherein $B_x$ is the value of the magnetic field component in the x-direction, $I_E$ is the emitter current $\mu_{Hn}$ is the n-type Hall mobility and K is a constant dependent on geometry and processing parameters.

In this description, bipolar transistor physics and operation are considered as well-known to the person skilled in the art and is therefore just briefly discussed in this description.

All conductivity types in the above illustrated example may be inverted (p-type to n-type, and n-type to p-type). In that case a technology is obtained having a buried P-well instead of a buried N-well. Although, this is a less conventional technology, it must be stressed that such technology is still feasible. The highly doped contact regions in the above example are not essential, but optional. Still, it is very advisory to use such contact regions, e.g. for reducing the contact resistance or for avoiding the formation of a Schottky diode at the contacts to the bipolar transistor (not shown).

Figure 7:
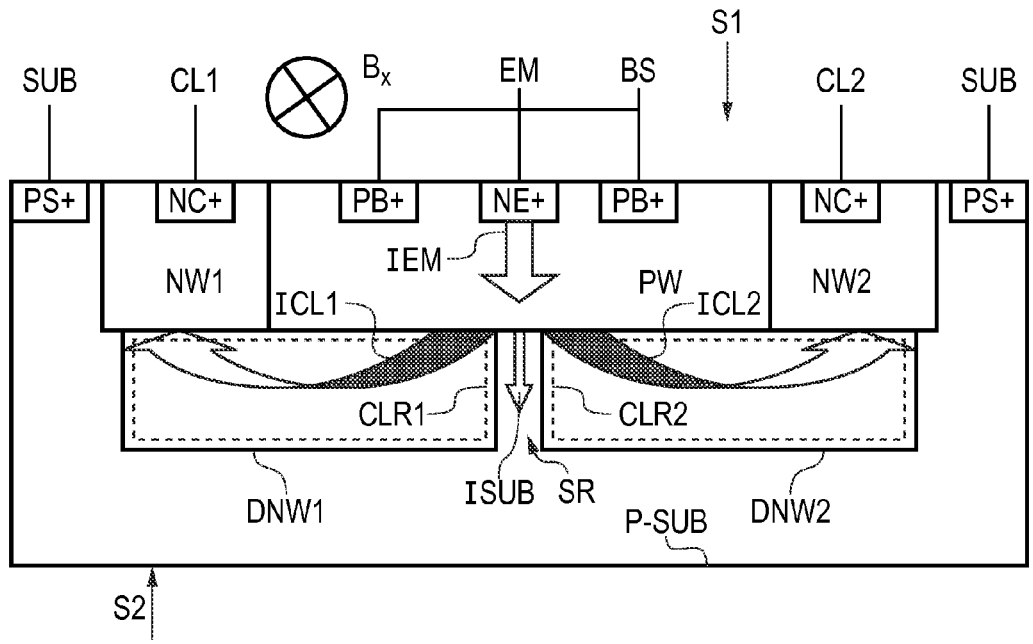
FIG. 7 shows a schematic cross-sectional view of a second embodiment of a magnetic field sensor which may be used in the integrated circuit of the invention.

FIG. 7 shows a schematic cross-sectional view of a second embodiment of a magnetic field sensor which may be used in the integrated circuit of the invention. This embodiment differs from the embodiment in FIG. 6 in that the collector regions CLR1, CLR2 are now formed as two separate buried N-wells DNW1, DNW2 which are separated in a direction parallel to the first side S1 of the substrate by a separating region SR. The separating region SR may be any type of non-conducting material or it may be, as is the case in this embodiment, part of the substrate P-SUB which is of an opposite conductivity type as the buried N-wells DNW1, DNW2. In this embodiment the potential of the emitter terminal EM is preferably kept at a negative potential with respect to the potential of the base terminal BS and the substrate terminal SUB (which is normally grounded). The base terminal BS is preferably connected to the substrate terminal SUB. This measure assures that the pn-junction at the base-emitter interface is forward-biased. The base-substrate interface then has no potential difference to prevent a substantial substrate current ISUB to occur which reduces the efficiency of the sensor. The electrons injected from the emitter are traversing the base region, where they are minority carriers. They will preferably flow to the collector regions at a higher potential than the substrate potential. The base transport factor of the bipolar transistor is, amongst other parameters, dependent on the base length. A rather long base length will result in a bipolar transistor with a very low base transport factor, or a high recombination. This will increase the base current and decrease the collector current. So, in order to decrease the recombination of the minority carriers (electrons) with the majority carriers (holes) in the base, the base length should preferably be small.

It is very likely that there is offset present in the output signal of the magnetic field sensor of FIG. 7 due to alignment errors or mismatches in the two sections of this intentionally symmetrical structure. With offset, it is meant that there is a difference between the collector currents ICL1, ICL2 when there is no magnetic field component $B_x$ perpendicular to the current plane. Mismatches may be the result of inhomogeneities in the doping levels of the wells NW1, NW2, DNW1, DNW2, PW. In some embodiments, this is not a big problem as long as the value of the offset is known and constant. Then the sign and magnitude of the offset may even help to randomize output of individual sensors in an array of sensors. Such array of sensors may be used in fingerprint or encryption key generation applications.

Figure 8:
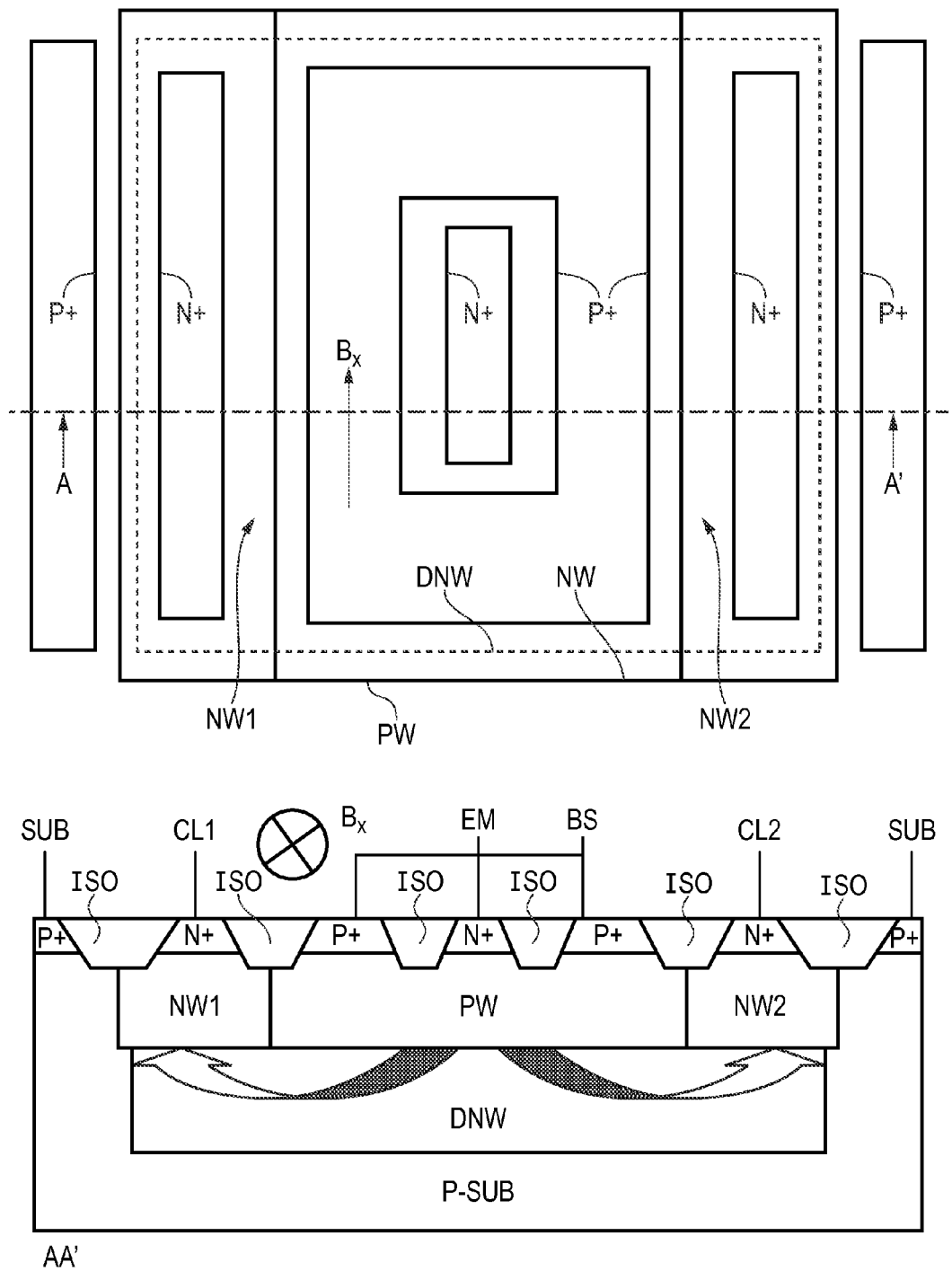
FIG. 8 shows a schematic top-view and a more-detailed schematic cross-sectional view of the magnetic field sensor of FIG. 6.

FIG. 8 shows a schematic top-view and a more-detailed schematic cross-sectional view of the magnetic field sensor of FIG. 6. In this Figure the isolation regions ISO are shown. The isolation regions ISO define areas where no diffusion regions may be formed. The regions preferably comprise silicon oxide in the form of shallow-trench isolation, also being referred to as STI, or local oxidation of silicon, also being referred to as LOCOS. However, other electrically isolating materials (like silicon nitride) are also possible, see for instance "http://www.thresholdsystems.com/news_sr.htm".

Figure 9:
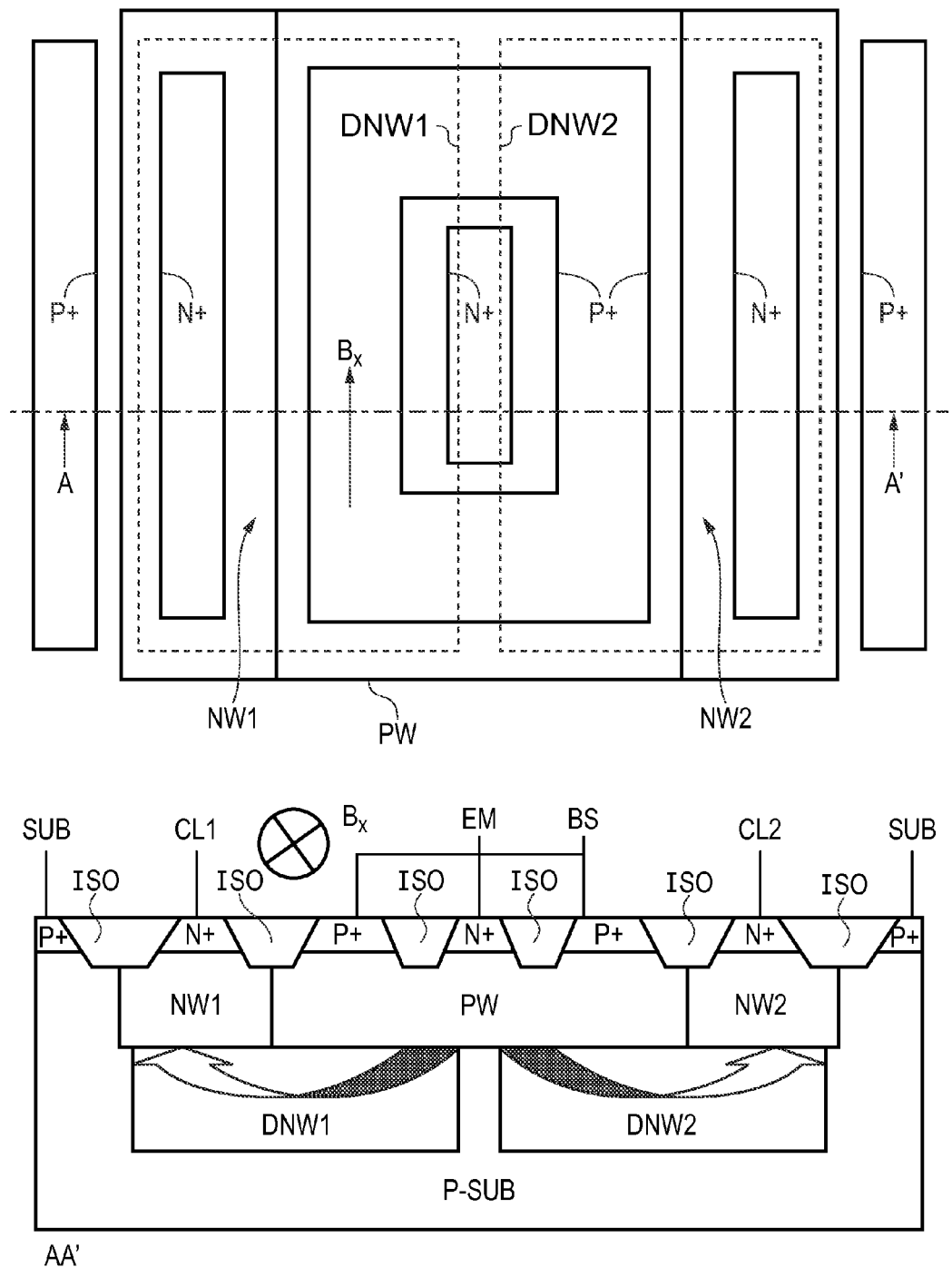
FIG. 9 shows a schematic top-view and a more-detailed schematic cross-sectional view of the magnetic field sensor of FIG. 7.

FIG. 9 shows a schematic top-view and a more-detailed schematic cross-sectional view of the magnetic field sensor of FIG. 7. In this Figure the isolation regions ISO are shown in a way similar to FIG. 8.

Figure 10:
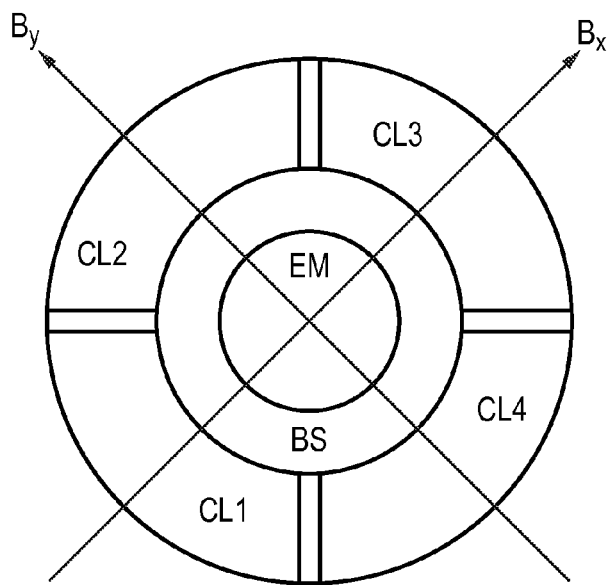
FIG. 10 shows a schematic top-view of a third embodiment of a magnetic field sensor which may be used in the integrated circuit of the invention.

FIG. 10 shows a schematic top-view of a third embodiment of a magnetic field sensor which may be used in the integrated circuit of the invention. The embodiments illustrated in FIGS. 6 and 7 may be extended towards two-dimensional field measuring capabilities by adding another pair of collector regions for enabling the measurement of a further magnetic field component $B_y$ in a direction parallel to the first side of the substrate. Effectively, a bipolar transistor having 4 collector terminals (CL1, CL2, CL3, CL4) is achieved instead of two. Preferably, the structure is designed symmetrically as illustrated in FIG. 10, which means that the current plane and the further current plane are perpendicular with respect to each other.

In the embodiment as illustrated in FIG. 10, during operation of the magnetic field sensor, collector regions C1 and C3 measure a first magnetic field component $B_y$, wherein the following formula may be derived:

$$\Delta I_{C13} = K' \cdot B_y \cdot I_E \cdot \mu_{Hn}.$$

wherein $\Delta I_{C13}$ is the difference in collector current between the collector regions C1, C3, wherein $B_y$ is the value of the magnetic field component in the y-direction, $I_E$ is the emitter current, $\mu_{Hn}$ is the n-type Hall mobility, and K' is a constant dependent on geometry and processing.

For the collector regions C2 and C4, measuring field component $B_x$ a similar formula may be derived:

$$\Delta I_{C24} = K' \cdot B_x \cdot I_E \cdot \mu_{Hn}.$$

wherein $\Delta I_{C24}$ is the difference in collector current between the collector regions C2, C4, wherein $B_x$ is the value of the magnetic field component in the x-direction, $I_E$ is the emitter current, $\mu_{Hn}$ is the n-type Hall mobility, and K' is a constant dependent on geometry and processing.

Figure 11:
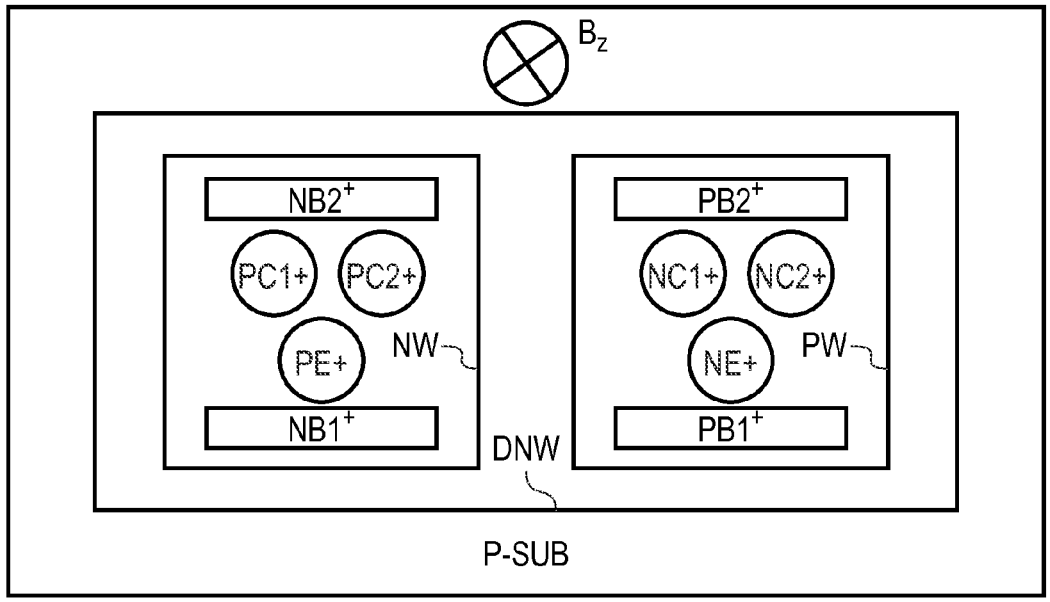
FIG. 11 shows a schematic top-view of a fourth embodiment of a magnetic field sensor which may be used in the integrated circuit of the invention.
Figure 12:
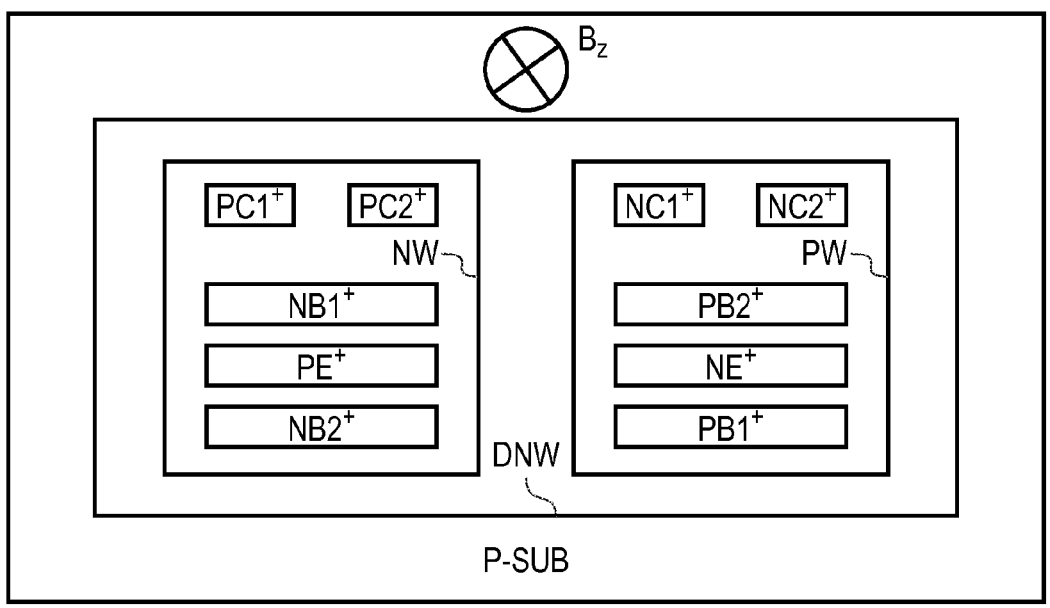
FIG. 12 shows a schematic top-view of a fifth embodiment of a magnetic field sensor which may be used in the integrated circuit of the invention.

FIGS. 11 and 12 show schematic top-views of a fourth and fifth embodiment of a magnetic field sensor which may be used in the integrated circuit of the invention. The embodiments constitute lateral magnetotransistors (LMT) compatible with triple-well CMOS technology. The LMT is sensitive to a magnetic field component perpendicular to the chip surface ($B_z$). In the embodiments of the magnetic field sensors of FIGS. 11 and 12 the collector regions NC1+, NC2+, PC1+, PC2+, the base region (formed by the N-well NW or P-well PW), and the emitter region NE+, PE+ are located above the buried N-well DNW and positioned with respect to each other in a direction parallel to the first side of the substrate P-SUB.

FIG. 11 shows a so called drift-aided LMT of the pnp (left) and the npn (right) type. There are two base contact regions NB1+, NB2+, PB1+, PB2+ arranged on both sides of the N-well (for the pnp-type) and the P-well (for the npn-type) for applying an electric field (by applying a different voltage on the contact regions) in the base region that helps the injected minority charge carriers from the emitter PE+, NE+ to reach the two collectors PC1+, PC2+, NC1+, NC2+. The current flowing between the two base terminals is a majority carrier current (electrons for the pnp-type and holes for the npn-type), as a result of which a lateral Hall field will build up, which influences the flow of minority carriers injected in the base region (holes in the pnp-type and electrons in the npn-type). The Lorentz force acting on these minorities thus has an additional effect, as it increases the differential collector current due to an additional Hall angle. The following formula may be derived:

$$\Delta I_C = K'' B_z I_E (\mu_{Hn} + \mu_{Hp})$$

wherein $\Delta I_C$ is the difference in collector current between the collector regions PC1+, PC2+, wherein $B_z$ is the value of the magnetic field component in the z-direction, $I_E$ is the emitter current, $\mu_{Hp}$ is the p-type Hall mobility, $\mu_{Hn}$ is the n-type Hall mobility, and K" is a constant dependent on geometry and processing. The physics behind and the operation of a drift-aided LMT is well-known to the person skilled in the art, for instance in S. Middelhoek and S. A. Audet, "Silicon sensors", Academic Press, 1989, ISBN 0-12-495051-5.

FIG. 12 shows an injection modulation LMT wherein a Hall voltage over the base-emitter junction causes a differential collector current. Both the pnp (left) and the npn type (right) are shown. There are two base contact regions NB1+, NB2+ arranged on both sides of the emitter region PE+, NE+. By applying a different voltage on the contact regions a Hall-voltage will build up which causes the injection into the base region (formed by the well regions NW, PW) to be non-uniform (e.g. the left-hand side of the emitter will inject more than the right-hand side). The physics behind and the operation of an injection modulation LMT is well-known to the person skilled in the art, for instance in S. Middelhoek and S. A. Audet, "Silicon sensors", Academic Press, 1989, ISBN 0-12-495051-5.

The magnetic field sensors discussed in FIGS. 6 to 12 are advantageously integrated in the integrated circuit in the card 100 as illustrated in FIG. 5, because of their compatibility with triple-well CMOS technology which is very likely a mainstream process technology starting from the 65 nm technology node.

The invention thus provides, in a first aspect, an integrated circuit comprising a substrate having a first side and a second opposing side. An electronic circuit is provided at the first side of the substrate, wherein the electronic circuit comprises at least one magnetic field sensor. The integrated circuit further comprises a magnetizable region provided on the second side of the substrate by using a deposition processing step. The magnetic moment of the magnetizable region is configurable for generating a magnetic field detectable at the location of the at least one magnetic field sensor. The integrated circuit constitutes a very simple construction. All what is needed is a magnetizable region on the second side and at least one magnetic field sensor on the first side of the substrate. Above that, these additional features can be provided on the substrate using lithographic techniques which enables a strongly miniaturized solution which is, because of its reduced dimensions well suitable for being used in bank cards. An attempt to remove the integrated circuit according to the invention from its environment (e.g. a bank card) may result in the magnetizable region getting damaged (partially removed) or even completely removed. In case the magnetizable region has been magnetized (such that it has a magnetic moment that results in a magnetic field detectable at the location of the at least one magnetic field sensor) this damaging or removal may be detected by the at least one magnetic field sensor according to the invention which provides a first level of security against external attack. The magnetic field sensor in accordance with invention is advantageously integrated in with the integrated circuit, because of its compatibility with triple-well CMOS technology which is very likely a mainstream process technology starting from the 65 nm technology node.

The invention provides, in a second aspect, a card provided with such integrated circuit. In an attempt to remove the integrated circuit from the card the magnetizable region may be partially removed (damaged) or completely removed. This removal will influence the magnetic field sensed by the magnetic field sensor. As soon a magnetic field change which may be an authenticity violation is detected the integrated circuit takes measures to prevent a hacker to retrieve information stored thereon, e.g. by erasing its contents or by resetting itself. The card in accordance with the invention is more secure.

The invention provides, in a third aspect, a method of initializing such integrated circuit, because in some embodiments the initialization of the integrated circuit is done somewhere else than the manufacturing and in other embodiments the integrated circuit may need re-initialization. The method of initializing comprises steps of:

determining an actual value of the magnetic field at the location of the at least one magnetic field sensor, and storing the actual value as a first reference value.

Optionally, the method comprises, before the step of determining an actual value, a further step of:

configuring the magnetizable region for generating a magnetic field detectable at the location of a further one of the at least one magnetic field sensor.

The invention provides, in a fourth aspect, a method of checking the authenticity of such integrated circuit. The method of checking the authenticity comprises steps of:

measuring an first actual value of the magnetic field at the location of the at least one sensor;

receiving the first reference value;

comparing the first reference value and the first actual value, and recognizing the authenticity of the integrated circuit only, if the difference between the first actual value and the first reference value is smaller than a predefined threshold value. Authentication of the integrated circuit is an important way of achieving a good security level for the integrated circuit. Once an integrated circuit has been identified as non-authentic appropriate actions, like erasing, resetting, self-destruction may be initiated, which prevents a hacker to gain access to data stored in the integrated circuit.

The invention may be applied in application areas where data security is of great importance, like bank-card applications (credit-card, smart-card, etc). Pay TV chips, SIM cards for mobile telephones.

Various variations of the integrated circuit, card and methods in accordance with the invention are possible and do not depart from the scope of the invention as claimed.

The invention claimed is:

1. An integrated circuit comprising:
a substrate having a first side and a second side, wherein the second side is opposite to the first side;
an electronic circuit provided on the first side of the substrate, wherein the electronic circuit comprises at least one magnetic field sensor having a bipolar magnetotransistor structure which is compatible with triple-well technology, and
a magnetizable region provided on the second side of the substrate that is configured to generate a magnetic field detectable by the at least one magnetic field sensor.

2. The integrated circuit as claimed in claim 1, wherein the at least one magnetic field sensor comprises a plurality of magnetic field sensors configured to locally sense the generated magnetic field.

3. The integrated circuit as claimed in claim 1, wherein the magnetizable region comprises a plurality of magnetization domains having a predetermined magnetization pattern.

4. The integrated circuit as claimed in claim 1, wherein the magnetizable region comprises a plurality of magnetization domains having a random magnetization pattern.

5. The integrated circuit as claimed in claim 1, wherein the magnetizable region is opaque for at least infrared and visible light.

6. The integrated circuit as claimed in claim 1, wherein the at least one magnetic field sensor is formed by a transistor of which a first electrode is split into a first and second region, each region carrying a detection current in case of detection, and a difference between the detection currents through the first and second regions is indicative for the magnetic field.

7. The integrated circuit as claimed in claim 6, wherein the transistor is a bipolar transistor with an emitter, a base, and a collector defined in a semiconductor layer of a first conductivity type, the semiconductor layer is provided with an emitter region of a second conductivity type constituting the emitter, a base region of the first conductivity type constitutes the base, and the first and second collector regions of the second conductivity type constitute the collector, and the first and second collector regions, the base region, and the emitter region are positioned with respect to each other such that, in operation, a part of an emitter current that traverses the base region is distributed over the first and second collector regions obtaining the first and the second detection current.

8. The integrated circuit as claimed in claim 7, wherein the semiconductor layer comprises a buried N-well extending parallel to the first side of the substrate, and the emitter region is located at the first side above the buried N-well.

9. The integrated circuit as claimed in claim 7, wherein a difference between the first and second detection currents is determined by a magnetic field component perpendicular to a current plane, the current plane is defined through the emitter region, the base region, and the first and second collector regions, extends in directions defined by the emitter current and the first and second detection currents, and the current plane extends in a direction perpendicular to the first side of the substrate.

10. The integrated circuit as claimed in claim 9, wherein the buried N-well comprises two parts separated in a direction parallel to the first side by a separating region of the substrate, the two parts forming the first and second collector regions.

11. The integrated circuit as claimed in claim 7, wherein the at least one magnetic field sensor further comprises:
a third collector region; and
a fourth collector region of the second conductivity type, the third and fourth collector region forming part of the collector of the bipolar transistor, wherein the third and fourth collector region, the base region, and the emitter region are positioned with respect to each other such that, in operation, a part of an emitter current that traverses the base region is also distributed over the third and fourth collector regions obtaining a third and a fourth collector current, a difference between the third and fourth collector currents is determined by a further magnetic field component perpendicular to a further current plane that extends in a direction perpendicular to the first side of the substrate, the further current plane is defined through the emitter region, the base region and third and fourth collector regions, and extends in directions defined by flow directions of the emitter current and the third and fourth collector currents.

12. The integrated circuit as claimed in claim 7, wherein the collector regions, the base region, and the emitter region are located at the first side above the buried N-well and positioned with respect to each other in a direction parallel to the first side.

13. A card provided with the integrated circuit as claimed in claim 1.

14. A method of initializing the integrated circuit as claimed in claim 1, the method comprising:
   determining an actual value of the magnetic field at the location of one of the at least one magnetic field sensor; and
   storing the determined actual value as a first reference value.

15. A method of checking the authenticity of the integrated circuit as claimed in claim 1, comprising:
   measuring a first actual value of the magnetic field at the location of one of the at least one sensor;
   receiving a first reference value;
   comparing the first reference value and the measured first actual value; and
   recognizing the authenticity of the integrated circuit only, if the difference between the first actual value and the first reference value is smaller than a predefined threshold value.

16. The integrated circuit of claim 8, wherein the buried N-well acts as a current path for a collector current of the bipolar transistor.

17. The integrated circuit of claim 4, wherein the random magnetization pattern creates a Physical Uncloneable Function (PUF).

18. The integrated circuit of claim 8, wherein the buried N-well acts as a current distributor.

19. The integrated circuit of claim 8, wherein the buried N-well acts as a current divider.

20. The integrated circuit of claim 7, wherein the semiconductor layer comprises a buried P-well.

* * * * *